(12) United States Patent
Endo et al.

(10) Patent No.: US 7,066,704 B2
(45) Date of Patent: Jun. 27, 2006

(54) COMPONENT FEEDER EXCHANGE CART, AND MECHANISM AND METHOD FOR POSITIONING COMPONENT FEEDER

(75) Inventors: Tadashi Endo, Nakakoma-gun (JP); Takao Kashiwazaki, Nakakoma-gun (JP); Akira Kabeshita, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 192 days.

(21) Appl. No.: 10/149,064

(22) PCT Filed: Dec. 7, 2000

(86) PCT No.: PCT/JP00/08640

§ 371 (c)(1),
(2), (4) Date: Oct. 1, 2002

(87) PCT Pub. No.: WO01/43522

PCT Pub. Date: Jun. 14, 2001

(65) Prior Publication Data
US 2003/0116934 A1    Jun. 26, 2003

(30) Foreign Application Priority Data
Dec. 7, 1999  (JP) ............................... 11/347583
Mar. 31, 2000 (JP) ............................. 2000-098356

(51) Int. Cl.
*B65G 67/00* (2006.01)

(52) U.S. Cl. ...................... 414/401; 414/373; 414/495; 414/497; 414/584; 414/660; 254/2 C; 254/8 R; 74/518

(58) Field of Classification Search ................ 414/401, 414/373, 584, 659, 660, 495, 497; 254/2 C, 254/8 R; 74/516, 517, 518

See application file for complete search history.

(56) References Cited

U.S. PATENT DOCUMENTS

| | | | | |
|---|---|---|---|---|
| 4,969,794 A | * | 11/1990 | Larsen | 414/495 |
| 5,144,369 A | * | 9/1992 | Benedict et al. | 414/401 |
| 5,826,624 A | * | 10/1998 | Graser | 139/1 R |
| 6,068,104 A | * | 5/2000 | Pflueger et al. | 198/345.3 |
| 6,454,512 B1 | * | 9/2002 | Weiss | 414/663 |
| 6,494,671 B1 | * | 12/2002 | Takaiti et al. | 414/809 |

FOREIGN PATENT DOCUMENTS

| | | |
|---|---|---|
| JP | 2-132895 | 5/1990 |
| JP | 5-299887 | 11/1993 |
| JP | 6-177586 | 6/1994 |
| JP | 7-226599 | 8/1995 |
| JP | 9-93000 | 4/1997 |

* cited by examiner

*Primary Examiner*—Eileen D. Lillis
*Assistant Examiner*—Michael Lowe
(74) *Attorney, Agent, or Firm*—Wenderoth, Lind & Ponack, L.L.P.

(57) ABSTRACT

A cart comprises a base frame, driver for extending an operational stroke of a hydraulic jack and transferring this movement into an up and down motion, a pair of elevating rods simultaneously lifted of lowered by movement of the driver, a pair of supporting frames for operably supporting the elevating rods by virtue of guide rollers, and a holder fixed to the elevating rods for lifting and lowering the component supply unit, wherein a multi purpose space is formed surrounded by the driver, the elevating rods, and the holder. By using a positioning mechanism containing a structure where a positioning pin of a fixing device fits into a V-shaped slot formed on a component supply unit side, a component supply unit may be positioned in two different directions by pushing the component supply unit in a single direction.

6 Claims, 20 Drawing Sheets

Fig.18                    Prior Art

COMPONENT FEEDER EXCHANGE CART, AND MECHANISM AND METHOD FOR POSITIONING COMPONENT FEEDER

This application is a National Stage of PCT/JP00/08640, filed Dec. 7, 2000.

FIELD OF THE INVENTION

The present invention relates to a cart for changing a component supply unit, which is used for installing the component supply unit onto a component mounting apparatus and removing the same from a component mounting apparatus. The present invention also relates to a component supply unit positioning mechanism for positioning a component supply unit relative to a component mounting apparatus, and a method of positioning a component supply unit.

BACKGROUND OF THE INVENTION

Recently, in the field of production of circuit formed materials, such as electronic circuit substrates, there has been a demand to reduce production cycle time and to improve operating efficiency of manufacturing facilities by reducing setup time when changing production models. In such setup time for a component mounting apparatus, it is important to fix a component supply unit so as to accurately position components at predetermined pick up locations of the component mounting apparatus. Especially, in order to respond to recent trends of miniaturization and weight reduction of electronic equipment, density of mounted components on a circuit formed material has increased. As a result, a component itself tends to be smaller, and hence even further accurate positioning of components at a setup time is required.

One known way to reduce setup time is simultaneous changing of supplying devices. When production of one specific model is completed, and a new model production is to be started, it is necessary to change a plurality of supplying devices, such as cassettes, for supplying a variety of components needed for production of the new model. Since numbers of different components are normally mounted on a single circuit formed material, it takes a considerably long time to change all of cassettes carrying these components. Simultaneous changing of a plurality of supplying devices, which may be conducted outside of the component mounting apparatus, has made it possible to complete these time consuming changes prior to a next setup timing. Consequently, setup may be performed in an efficient manner. In order to perform this simultaneous changing smoothly, a cart for changing component supply units (hereinafter, referred to as a "cart") is used.

A component supply unit for holding a plurality of supplying devices as well as the cart for mounting and transporting the component supply unit are required to satisfy conditions such as accurate positioning capability, low cost, stability and easy handling. In the course of aforementioned trends of miniaturization of components and increasing of component mounting density, further improvement of accurate positioning for a purpose of repeated setup is required.

Now, a component mounting apparatus and a cart of prior art is described by referring to the appended drawings. In the following explanation, a substrate is used as a representative of circuit formed materials. In recent years, however, components may be mounted even on a casing of electronic equipment. Therefore, a term "substrate" used hereinafter includes all these kinds of materials in addition to an electronic circuit substrate. FIG. 17 schematically illustrates an overall view of a conventional component mounting apparatus. Referring to FIG. 17, a transferring device 101 transfers a substrate 102 into and out of the component mounting apparatus, and holds the substrate at a predetermined position while a component 103 is being mounted on it. In order for a mounting head 108 to perform a series of operations, such as sucking a component 103 from a component supply unit 106 (tray type) or 107 (cassette type), and mounting the component 103 onto the substrate 102, XY robot 104 transports the mounting head 108 toward these predetermined positions and holds it at the positions. Recognizing camera 109 images and recognizes a condition of sucked component 103 while the component 103 is being held by the mounting head 108.

Next, an operation of the component mounting apparatus structured as above is described. The substrate 102 is transferred to a mounting position and firmly held by the transferring device 101. The XY robot 104 transports the mounting head 108 to a position just above the component supply unit 107, and each nozzle attached to the head 108 sucks a component 103 for picking up these components. A condition of the component 103 sucked by each nozzle is imaged by the recognizing camera 109. Based on information recognized and obtained by the camera 109, necessary adjustment of a position of the mounting head 108 and an angle of the components 103 is made, and then the mounting head 108 mounts the component 103 on a predetermined mounting position of the substrate 102.

Next, the component supply unit 107 for holding a plurality of cassettes 112, and a cart 120 used for simultaneous changing of a plurality of cassettes 112 are described. After a plurality of cassettes 112 are attached to the component supply unit 107, the component supply unit 107 is installed on the component mounting apparatus and positioned by engaging with two positioning pins 114 provided at a fixing device 113 of the component mounting apparatus. FIG. 18 shows a schematic perspective view of the cart 120 used for installing the component supply unit 107 onto the component mounting apparatus. Referring to FIG. 18, the cart 120 mainly comprises a base frame 121, lifter 122, holder 123, and a handle 124. The base frame 121 includes a movable and maneuverable trolley having four total wheels including two caster wheels. A lift pedal 126 is provided on the base frame 121 for operating a hydraulic jack to lift or lower the holder 123.

The component supply unit 107 is mounted on a central portion of U-shaped holder 123, which is supported by the lifter 122. At both ends of the holder 123 in an X direction of FIG. 18, positioning bars 127 having a pair of protrusions for each are provided for positioning the cart 120 in a Z direction of this figure. When the cart 120 is moved toward the component mounting apparatus in a Y direction for installing the component supply unit 107 onto the component mounting apparatus, the positioning bars 127 engage with corresponding guides provided on the component mounting apparatus. Each protruded end of the bar 127 has a tapered portion which makes engagement with the guide easier. The handle 124, structured by a pair of bars, is used by an operator for maneuvering the cart 120 structured as above.

Now, a setup operation of the component supply unit 107 after completion of a production of one model and before starting production of another model is described. Referring back to FIG. 17, a cassette 112 carrying components needed for a model of completed production is still fixed to the component mounting apparatus at one of the fixing devices 113. A vacant cart 120 is moved forward to the fixing device 113. The component supply unit 107 is pulled back onto the holder 123 of that cart 120, and then lift pedal 126 is operated for lifting holder 123. By this operation, the component supply unit 107 installed on the component mounting apparatus is lifted from the component mounting apparatus and held by the holder 123. When the cart 120 is moved backward together with the component supply unit 107, all the cassettes 112 installed on the component supply unit 107 are removed from the component mounting apparatus at once by performing a single operation.

Next, a different component supply unit 107 holding a plurality of cassettes 112 for a next production model is mounted on the holder 123 of the cart 120. The operator moves this cart 120 forward to the fixing device 113 of the component mounting apparatus. Then, the operator operates lift pedal 126 for lifting up holder 123 together with the component supply unit 107. The cart 120 is then further moved forward, and after the operator confirms that U-shaped slots provided in the component supply unit 107, which will be described in detail later, engage with locating pins 114 provided on the fixing device 113, the operator again operates the lift pedal 126 for lowering the component supply unit 107. The component supply unit 107 is now positioned firmly on the fixing device 113 of the component mounting apparatus. After the component supply unit 107 is installed, vacant cart 120 is pulled backward, and production resumes.

FIG. 19 shows the component supply unit 107 viewed from its bottom, illustrating a positioning mechanism for fixing the unit 107 to the component mounting apparatus. When the component supply unit 107 is mounted on the component mounting apparatus, the component supply unit 107 is pushed forward to a base line of the component mounting apparatus shown by a double-dashed line A—A. In this figure, a bottom surface of the component supply unit 107 comprises base plate 116. This base plate 116 functions as a reference plane for positioning the component supply unit onto the component mounting apparatus in a horizontal direction.

Extended portions 117 and 118, are formed in the vicinity of both ends of the base plate 116 in an X direction, each of which has a U-shaped slot 119 facing the component mounting apparatus. By pushing both of the extended portions 117 and 118 firmly against the double-dashed line A—A, the component supply unit is positioned relative to the component mounting apparatus in a Y direction shown in FIG. 19. And when the positioning pins 114 located on the fixing device 113 of the component mounting apparatus fit into the U-shaped slots 119 formed at both extended portions 117 and 118, the component supply unit is positioned firmly on the component mounting apparatus in the X direction. After the component supply unit is fixed in position, a clamp, not shown in this figure, is operated for fixing the component supply unit 107 to the component mounting apparatus, thereby readying the component mounting apparatus for resuming a component mounting operation.

In FIG. 19, the U-shaped slots 119 are formed at both extended portions 117 and 118. It is known, however, that U-shaped slot 119 may be formed at only one of the extended portions 117 or 118, and the other portion 117 or 118 may have a flat surface which contacts with the reference plane formed at a component mounting apparatus side. In either case, the positioning pins 114 and the U-shaped slot(s) 119 are to be tightly engaged with each other in order to position the component supply unit 107 on the component mounting apparatus. Therefore, the operator is required to perform a technique to properly move the cart 120 for achieving this tight engagement between the positioning pins 114 and the U-shaped slot(s).

SUMMARY OF THE INVENTION

According to the component supply unit of prior art structured as above, it is technically difficult to conduct simultaneous changing while achieving a high level of positioning accuracy. Because of recent requirements to achieve efficient utilization of manufacturing facilities, a large reel carrying a tape containing increased number of components are used on a cassette. Accordingly, a weight of a single cassette has increased to 3 kg or 5 kg. Furthermore, because of recent requirements of multi functioning of electronic products, a number of cassettes 112 to be installed on a component supply unit 107 has increased to 20 or 30. The component supply unit 107 used for simultaneous changing, therefore, should have sufficient rigidity to withstand such a heavy load weighing 50 kg to even 200 kg in total. As a result, the cart 120 is also required to have stronger structure, which leads to increased size and cost of the cart 120. Also, careful handling is required to accurately position such a heavy item, and accordingly, present operability of the cart is not considered satisfactory.

Furthermore, lifter 122 of the cart 120 of the prior art may need to have a linear moving bearing or specially designed rail for lifting and lowering such a heavy item, which requires increased cost and larger space. Since the lifter 122 includes a hydraulic jack located just beneath the holder 123 for supplying a lifting force to the holder 123, extra space may not be available in a central area of the cart 120. Because of this space limitation, it is difficult to allocate a utility space in the cart 120, which may be used for, for example, accommodating reels having components in a tape to be supplied by the cassette 112, or may be used for collecting a supplying tape or its cover tape after it is used. If these spaces are prepared outside of the cart 120, excessive floor space is necessary near the component mounting apparatus, which may create a further problem of operability of and accessibility to the component mounting apparatus.

Moreover, installing the component supply unit 107 onto the component mounting apparatus by using cart 120 of the prior art may not satisfy a recent requirement of reducing setup time, and may cause a problem for maintaining accuracy for repeated operations. The cart 120 itself has a problem of its high cost, and increased size.

Accordingly, an object of the present invention is to resolve the above-mentioned problems, and to provide a cart for changing a component supply unit, which may reduce setup time in a case producing a variety of substrates, achieve a high level of positioning accuracy, with increased safety, easier handling and low cost, and be capable of using a compact lifter. Also, it is an object of the present invention to provide a positioning mechanism and positioning method for achieving accurate and easy positioning of a component supply unit.

One aspect of the present invention relates to a cart for changing a component supply unit, which is connectible with and separable from a component mounting apparatus for a purpose of simultaneously changing a plurality of supplying devices attached to the component supply unit by installing the component supply unit onto the component mounting apparatus, or removing the same from the component mounting apparatus, wherein the cart has a multi purpose utility space beneath the component supply unit mounted on the cart. By utilizing such multi purpose space, operability of the cart is improved by lowering a center of gravity of the cart having the component supply unit, and by reducing an amount of extensions of the cart.

Another aspect of the present invention relates to a cart including: a base frame having wheels including caster wheels; a driver accommodated inside the base frame; a pair of lifters fixed to the base frame and to be driven simultaneously by the driver, and a holder fixed to a pair of the lifters for mounting the component supply unit, wherein a space is surrounded by the base frame and the pair of lifters.

Another aspect of the present invention relates to a cart in which a reel box and/or a collecting box is (are) provided in a space for accommodating a reel around which a supplying tape of the supplying device attached to a component supply unit is wound, and/or for collecting used supplying tapes or used cover tapes for covering the supplying tapes.

The driver mentioned above may include a hydraulic jack, and a lever mechanism for transferring extending and contracting movements of the hydraulic jack to the lifters simultaneously. Each of lifters mentioned above may include an elevating rod driven by the driver for lifting and lowering motions, and a supporting frame having a linear bearing structure for movably supporting the elevating rod in up and down directions. The linear bearing structure may include first engaging elements formed on an outer surface of the elevating rod along a first direction parallel to an up and down motion of the elevating rod, which engaging elements are formed on two sides of the outer surface opposing each other in a second direction perpendicular to the first direction, and second engaging elements formed on circumferences of at least three guide rollers rotatably fixed to each of supporting frames for holding the elevating rod from both sides of the second direction, wherein when the first engaging elements engage with the second engaging elements, the at least three guide rollers guide a movement of the elevating rod in the first direction while restricting movement of the elevating rod in the second direction as well as a third direction perpendicular to both the first and the second directions.

Yet another aspect of the present invention relates to a cart wherein a safety mechanism is provided for restricting movements of the driver depending on a distance between the cart and the component mounting apparatus when the cart is moved forward to or moved away from the component mounting apparatus. The safety mechanism is designed to be switched in three different stages including a first stage in which downward movement of the component supply unit is restricted while the cart is completely separated from the component mounting apparatus, a second stage in which both upward and downward movements of the component supply unit are allowed while the cart is in a predetermined range of a close distance from the component mounting apparatus, and a third stage in which upward movement of the component supply unit is restricted while the cart is fully pushed forward to the component mounting apparatus. More specifically, the safety mechanism controls movements of a release lever of a hydraulic jack, or a driving source, wherein in the first stage, movement of the release lever is restricted so as to not release hydraulic pressure for maintaining the hydraulic jack in an extended position; in the second stage, movement of the release lever is permitted so as to allow extending and contracting of the hydraulic jack, and in the third stage, movement of the release lever is restricted so as to release hydraulic pressure for maintaining the hydraulic jack in a contracted position.

Yet another aspect of the present invention relates to a cart in which a holder is equipped with a buffer type fixing mechanism for permitting separation of a component supply unit from the holder by a predetermined distance when the component supply unit is to be mounted on the holder for installing the component supply unit onto the component mounting apparatus. This mechanism is designed to mount the component supply unit safely on the holder of the cart and to position the component supply unit relative to the component mounting apparatus securely.

The buffer type fixing mechanism may include at least one bolt which is inserted into a through hole of a holding arm and fastened to a bottom surface of the component supply unit for holding the component supply unit onto the holder, and a spring which may be compressed and held between a bolt head of the bolt and the holding arm, wherein the buffer type fixing mechanism separably holds the component supply unit onto the holding arm by virtue of an elastic force of a spring at the place where the bolt is fastened.

Another aspect of the present invention relates to a cart which may be separated from the component mounting apparatus after a component supply unit is installed on the component mounting apparatus. The cart may be used for other purposes after it is separated from the component mounting apparatus.

Yet another aspect of the present invention relates to a mechanism for positioning a component supply unit, capable of holding a plurality of supplying devices, onto a fixing device provided on the component mounting apparatus when the component supply unit is to be installed on the component mounting apparatus, including: a first positioning mechanism for positioning the component supply unit onto a first plane in a substantially horizontal direction, and a second positioning mechanism for positioning the component supply unit onto a second plane which is substantially perpendicular to the first plane, wherein the second positioning mechanism further comprises a third positioning mechanism for restricting movement of the component supply unit in a direction parallel to a line defined by an intersection of the first and the second planes. By arranging the second positioning mechanism to function as a third positioning mechanism, operation of positioning may be performed quite easily with simple structures.

The first positioning mechanism may include: two horizontal guide planes, which are parallel to the first plane, provided on the fixing device, and two flat portions formed on a bottom surface of the component supply unit and facing the two horizontal planes, respectively, wherein when each of the flat portions is placed on each of the horizontal guide planes, respectively, the component supply unit may be positioned on the first plane.

The second positioning mechanism may include: two positioning elements attached to the fixing device forming a substantially vertical second plane perpendicular to the first plane, and two contact elements formed on the component supply unit, having a distance between each other and facing the two positioning elements, respectively, wherein, after the component supply unit is positioned on the first plane, the component supply unit is positioned on the second plane by pushing the component supply unit toward the component mounting apparatus so that the two contact elements may contact with the two positioning elements, respectively.

The third positioning mechanism is formed by a combination of one of the two positioning elements provided on the fixing device and one of the two contact elements provided on the component supply unit, wherein the component supply unit is positioned in a direction parallel to a line defined by an intersection of the first and the second planes by virtue of a pair of elemental forces generated at a pair of contact points between the contact element and the positioning element when the contact element of the component supply unit is pushed forward against the positioning element attached to the fixing device during positioning of the component supply unit on the second plane. Either one of the positioning element and the contact element may be in the form of a V-shaped slot, while the other may be in the form of a circular protrusion.

Another aspect of the present invention relates to a component supply unit positioning mechanism including: a first guide mechanism for once blocking forward movement of the component supply unit in a direction toward the component mounting apparatus; a second guide mechanism for guiding the component supply unit to lower and place the component supply unit onto a horizontal guide plane after forward movement of the component supply unit is once blocked at a predetermined position; a third guide mechanism for guiding further forward movement of the component supply unit mounted on the horizontal guide plane toward the component mounting apparatus so as to push two contact elements formed on the component supply unit against two positioning elements, respectively; a fourth guide mechanism for once blocking backward movement of the component supply unit in a direction moving away from the component mounting apparatus during a time of removing the component supply unit from the component mounting apparatus; and a fifth guide mechanism for guiding upward movement of the component supply unit so as to make it possible to remove the component supply unit from the component mounting apparatus after backward movement of the component supply unit is once blocked at a predetermined position.

The component supply unit may include a pair of stopper bolts attached to a pair of vertical surfaces located on both side ends perpendicular to a direction of forward movement of the component supply unit toward the component mounting apparatus, and the fixing device of the component mounting apparatus may include vertical stoppers, horizontal stoppers, and slots facing each of the vertical surfaces, wherein a pair of the stopper bolts and a pair of the vertical stoppers function as the first and fifth guide mechanisms; a pair of the stopper bolts and a pair of the horizontal stoppers function as the second and fourth guide mechanisms; and a pair of the stopper bolts and a pair of the slots function as the third guide mechanism.

Yet another aspect of the present invention relates to a method of positioning a component supply unit for installing the component supply unit onto a fixing device of a component mounting apparatus, including: a first positioning step for positioning the component supply unit onto a substantially horizontal first plane, including moving forward the component supply unit toward the fixing device, once blocking this forward movement at a predetermined position, and lowering and placing the component supply unit onto the fixing device; and a second positioning step for positioning the component supply unit on a substantially vertical second plane perpendicular to the first plane, including further moving forward the component supply unit placed and positioned on the first plane, and blocking this forward movement at a predetermined position, wherein during the second positioning step, the component supply unit is simultaneously positioned in a direction parallel to a line defined by an intersection of the first and the second planes. According to this method, the component supply unit may easily and securely be positioned with simple structures.

BRIEF DESCRIPTION OF THE DRAWINGS

FIGS. 12(A) to 12(C) show a hydraulic pressure releasing mechanism used for one embodiment of a cart for changing a component supply unit according to the present invention, wherein FIG. 12(A) illustrates a locking stage for preventing release of hydraulic pressure, FIG. 12(B) illustrates a different stage for allowing hydraulic jack operation, and FIG. 12(C) illustrates a locking stage for preventing a lifting operation of the component supply unit.

FIGS. 13(A) to 13(F) show installing and removing operations of a component supply unit according to one embodiment of the present invention, wherein FIGS. 13(A) to 13(D) illustrate an installing operation and FIGS. 13(E) to 13(A) illustrate a removing operation.

FIGS. 14(A) and 14(B) show a mechanism for clamping a component supply unit according to the present invention, wherein FIG. 14(A) illustrates a stage prior to clamping and FIG. 14(B) illustrates a stage after clamping.

DETAILED DESCRIPTION OF THE PREFERRED EMBODIMENTS

Figure 1:
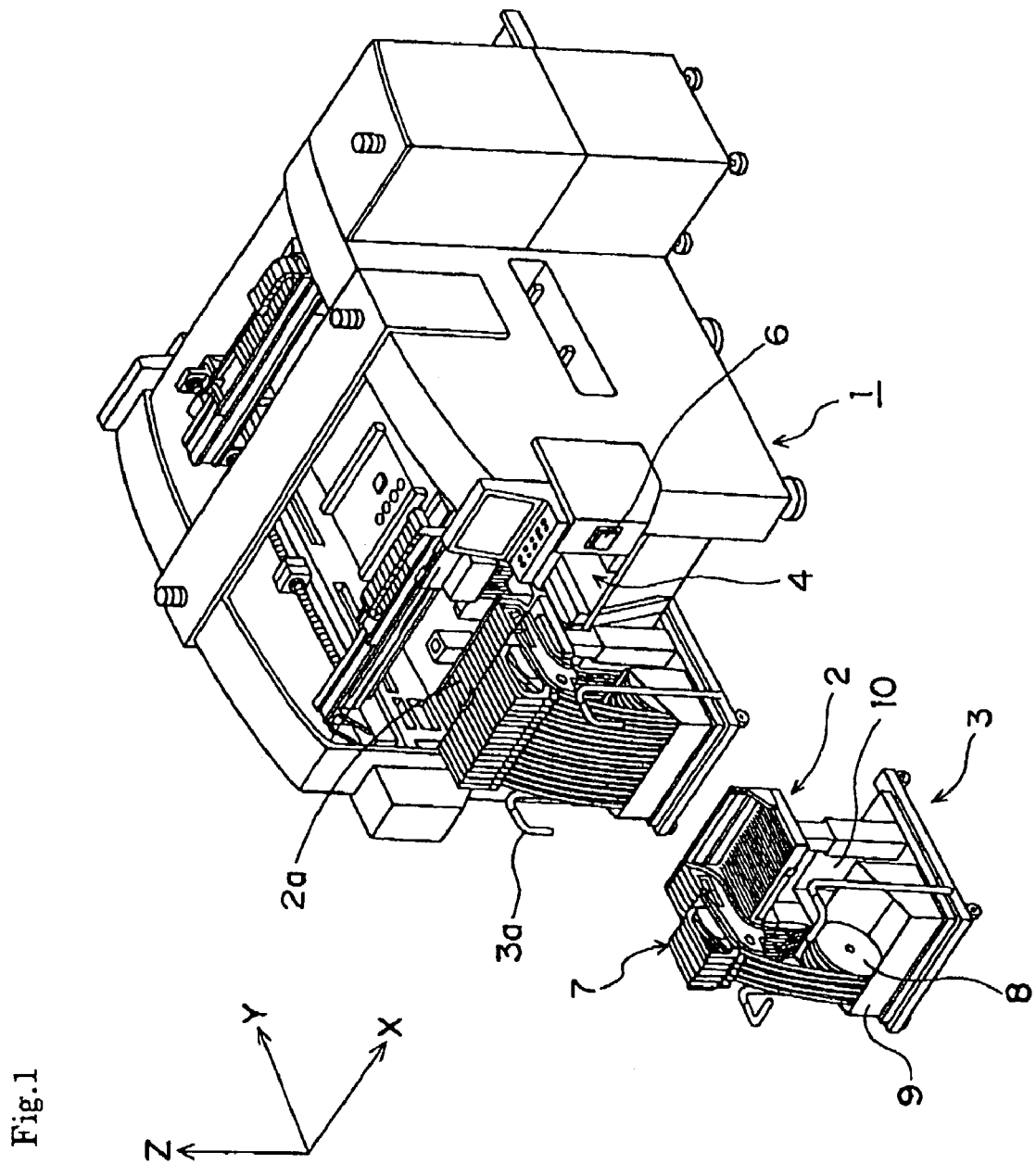
FIG. 1 is a perspective view showing schematically a component mounting apparatus using one embodiment of a cart for changing a component supply unit according to the present invention.

A first embodiment of a cart for changing a component supply unit and a mechanism for positioning the component supply unit according to the present invention are described by referring to appended drawings. FIG. 1 shows a component mounting apparatus 1, a component supply unit 2 used for simultaneous changing of components, and a cart 3 for changing the component supply unit 2 (hereinafter, referred to as a "cart") according to the present embodiment. Referring to FIG. 1, two fixing devices 4 are provided on the component mounting apparatus 1 for locating two component supply units 2 at one time. One of the fixing devices 4 on the left hand side of an X direction of this figure holds a component supply unit 2a by using a cart 3a. The fixing device 4 on the right hand side in the X direction of the figure is ready for receiving another component supply unit 2 held by another cart 3. A clamp switch 6 is provided to operate a clamp mechanism for securely fixing the component supply unit 2 to the component mounting apparatus 1. Other structures of the component mounting apparatus 1 are similar to those explained above in connection with the conventional component mounting apparatus.

Referring to FIG. 1, the component supply unit 2 holding a plurality of cassettes 7 (or supplying devices), is ready to be installed onto the component mounting apparatus 1. Each cassette 7 shown in the figure is so designed that a reel portion 8 carrying a component supplying tape may be accommodated in a reel box 9. Due to this cassette design, the cart 3 according to the present embodiment may reduce an extension amount of the cassette 7 when the cart 3 is attached to the component mounting apparatus 1, and may keep its center of gravity at a low position, which makes handling of the cart 3 easier. A collecting box 10, also provided at a central area of the cart 3, may be used for collecting component supplying tapes, or cover tapes for protecting components contained in the component supplying tapes, after they are used.

In FIG. 1, component supply unit 2a installed on the component mounting apparatus 1 is shown in a condition that the cart 3a is still attached to the component supply unit 2a. According to this condition, the reel box 9 and/or the collecting box 10 provided on the cart 3 may be fully utilized for accommodating reels and/or collecting used tapes. The cart 3, however, may alternatively be designed to be separable from the component mounting apparatus 1 during operation, rather than being attached to the component mounting apparatus 1, if required. This will be further described later.

Figure 2:
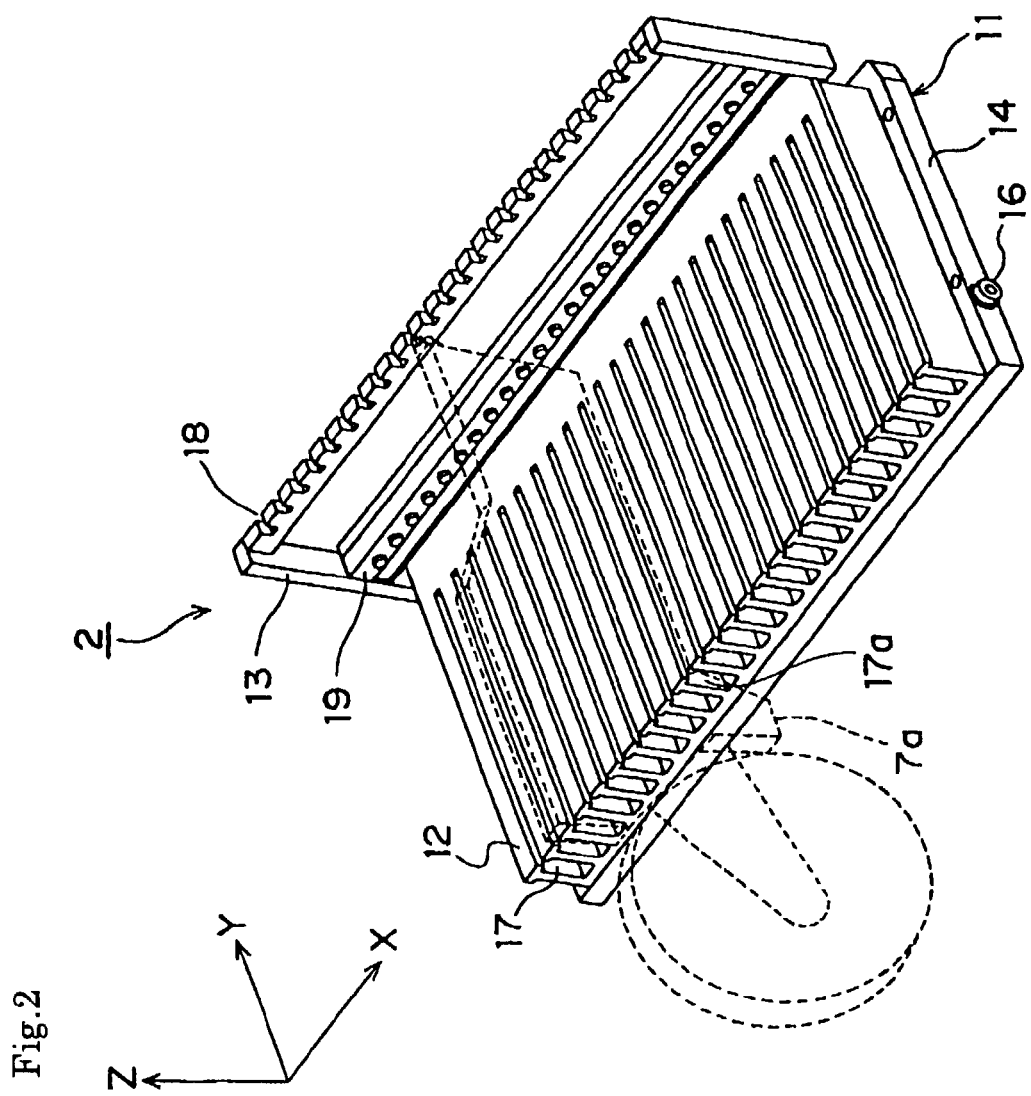
FIG. 2 is a perspective view of one embodiment of a component supply unit according to the present invention.

FIG. 2 shows the component supply unit 2 according to the present embodiment. Referring to FIG. 2, the component supply unit 2 mainly comprises a base plate 11, holder plate 12 fixed on the base plate 11, and a guide plate 13 attached vertically to the holder plate 12. A stopper bolt 16 is provided on each of a pair of vertical surfaces 14 located at both ends of the base plate 11 in an X direction of this figure. The stopper bolts 16 are used as guides when installing the component supply unit 2 onto the component mounting apparatus 1. A plurality of undercut slots 17 are formed in the holder plate 12 for holding a plurality of cassettes. Each cassette 7 is slid into each undercut slot 17 for attachment. Broken lines show one cassette 7a being attached to one of the undercut slots 17a. The cassettes 7 attached may be as many as the number of the slots 17. A plurality of positioning slots 18 are formed on a top of the guide plate 13 for positioning the cassettes 7. Also provided in the guide plate 13 below the positioning slots 18 is an air joint 19 for supplying air to the cassettes 7 individually.

Figure 3:
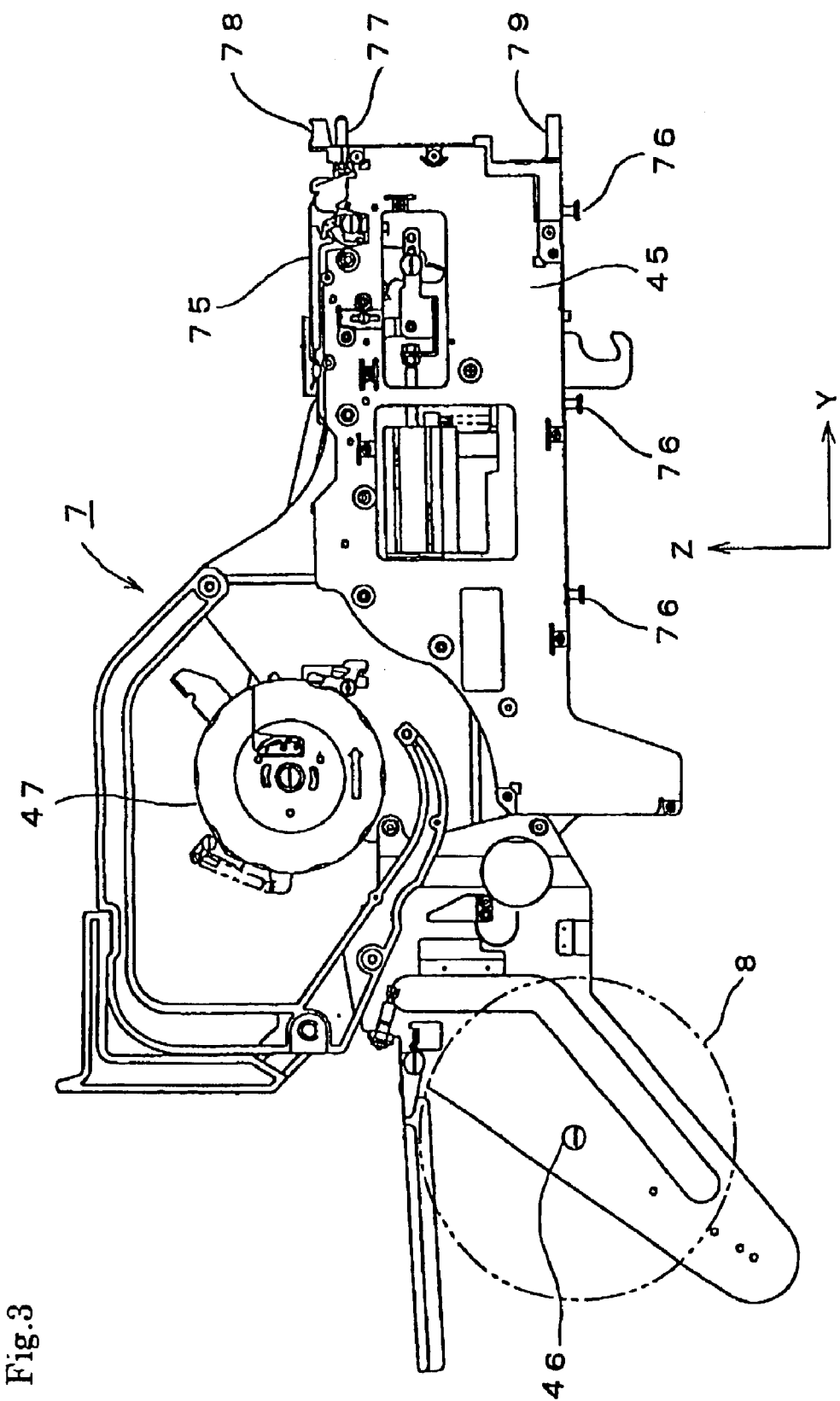
FIG. 3 is a side elevational view showing an example of a cassette which may be attached to a component supply unit used for simultaneous changing.

FIG. 3 shows an example of a cassette 7. Right hand side in a Y direction of this figure faces the component mounting apparatus 1. The cassette 7 mainly comprises a body 45, a reel holder 46, and a tape winder 47. A reel 8 carrying a component supplying tape containing many components may be attached to the reel holder 46. The component supplying tape is wound up on the reel 8, and is driven by the tape winder 47 intermittingly. Components are picked up one after another by the component mounting apparatus 1 at a component pick up position 75 provided on the body 45. Undercut fixing pins 76 are provided on a bottom of the body 45 of the cassette 7. When the cassette 7 is attached to the component supply unit 2, the fixing pins 76 are slid into one of the slots 17 formed on holder plate 12. A locating pin 77 is provided on a right end surface of the body 45 in the Y direction of the figure. This locating pin 77 is to be located in the positioning slot 18 formed in the guide plate 13 for positioning cassette 7 relative to the component supply unit 2. Also provided on the right end surface of the body 45 in the Y direction of the figure are a connector 78 and an air joint 79. The connector 78 is to be connected to another connector provided on the component mounting apparatus for transmitting electric signals, which will be described later. The air joint 79 is to be connected to the air joint 19 provided in the guide plate 13 of the component supply unit 2 for supplying air for operating a shutter covering a component supplying tape located at the component pick up position 75.

In FIG. 3, although the reel holder 46 is shown at a higher position of the cassette 7 than in the case of prior art, the reel holder 46 may be lowered in a Z direction of this figure as mentioned above, so that the reel 8 may be accommodated in the reel box 9 provided on the cart 3 of the present embodiment.

Figure 4:
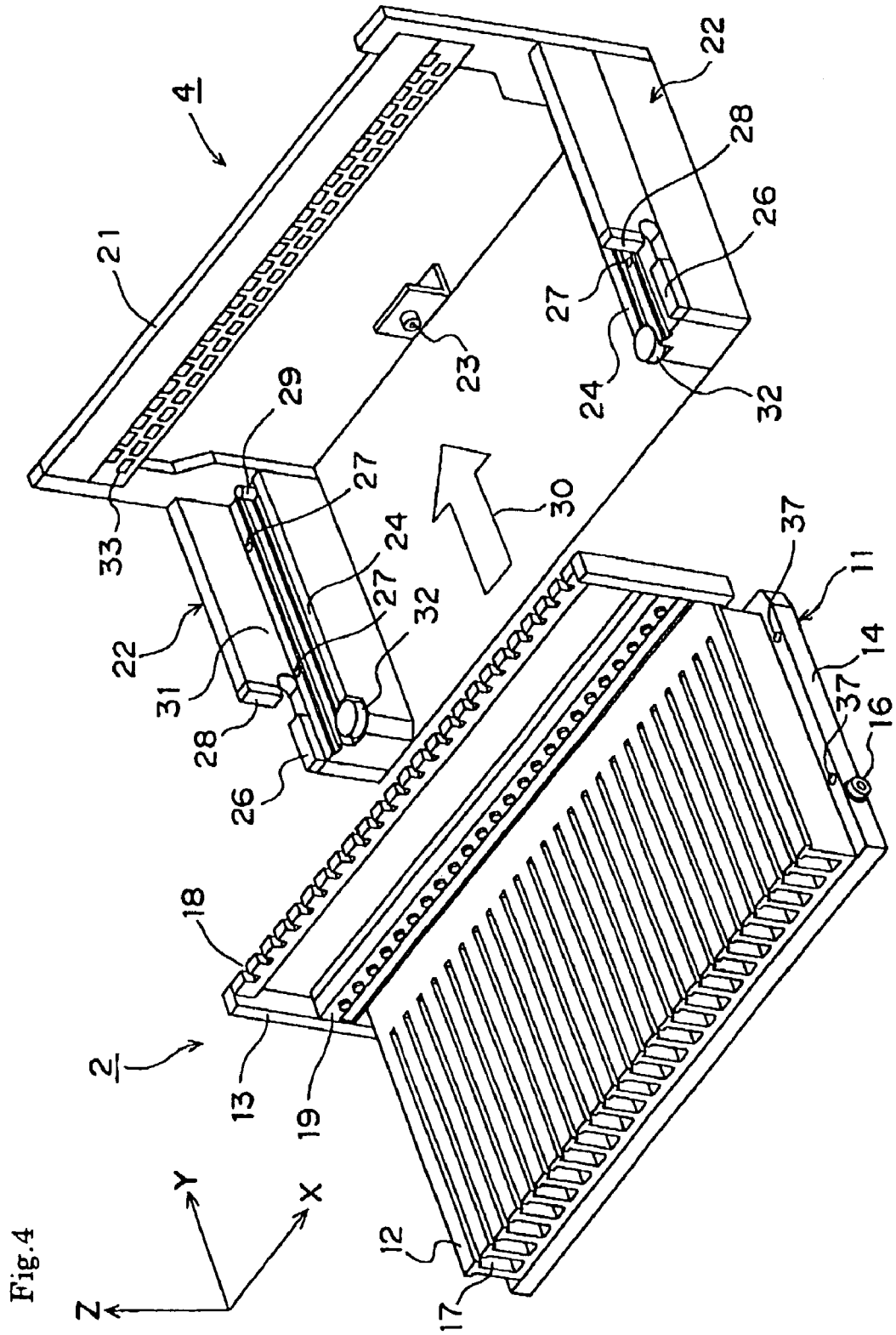
FIG. 4 is a perspective view showing one embodiment of a component supply unit and a fixing device for the component supply unit.

FIG. 4 shows the component supply unit 2 structured as above, and the fixing device 4 for receiving the component supply unit 2 provided on a component mounting apparatus side. The fixing device 4 includes an end plate 21, and a pair of arm plates 22 at both ends of the end plate 21 in an X direction of this figure. By this arrangement, blocking walls in three directions are formed by plates 21 and 22. An air joint 23 is provided on the end plate 21 for supplying air to the component supply unit 2. This air joint 23 is to be connected to another air joint provided to component supply unit 2, which will be described below. Also provided on the end plate 21 are connectors 33 for transmitting and receiving electric signals. These connectors 33 are to be electrically connected to connectors 78 provided on the cassettes 7 (see FIG. 3), respectively, when a corresponding cassette 7 is installed on the component supply unit 2.

Both of the arm plates 22 are equipped with a guiding and positioning mechanism for positioning component supply unit 2 onto the component mounting apparatus 1. Each arm plate 22 includes a horizontal guide surface 24 and a horizontal stopper 26 for guiding and positioning the component supply unit 2 in a Z direction (upper and lower direction) of FIG. 4, a vertical stopper 28 and a positioning pin 29 for guiding and positioning component supply unit 2 in a Y direction (forward and backward direction) of this figure, and a vertical guide plate 31 and a guide roller 32 for guiding component supply unit 2 in the X direction (right and left direction) of the figure. The horizontal guide plate 24 and the positioning pin 29 position the component supply unit 2 onto a predetermined location of the fixing device 4 when it is installed. Other elements, i.e. horizontal stopper 26, vertical stopper 28, vertical guide plate 31 and the guide roller 32 serve to guide the component supply unit 2 when it is to be installed on or removed from the component mounting apparatus 1. The positioning pin 29 according to the present embodiment serves to position the component supply unit 2 in the Y direction, as well as in the X direction. Four fixing holes 27 formed on both arm plates 22 may be used for permanently fixing the component supply unit 2 onto the fixing device 4 by screwing bolts through fixing holes 37 provided in the component supply unit 2.

Figure 5:
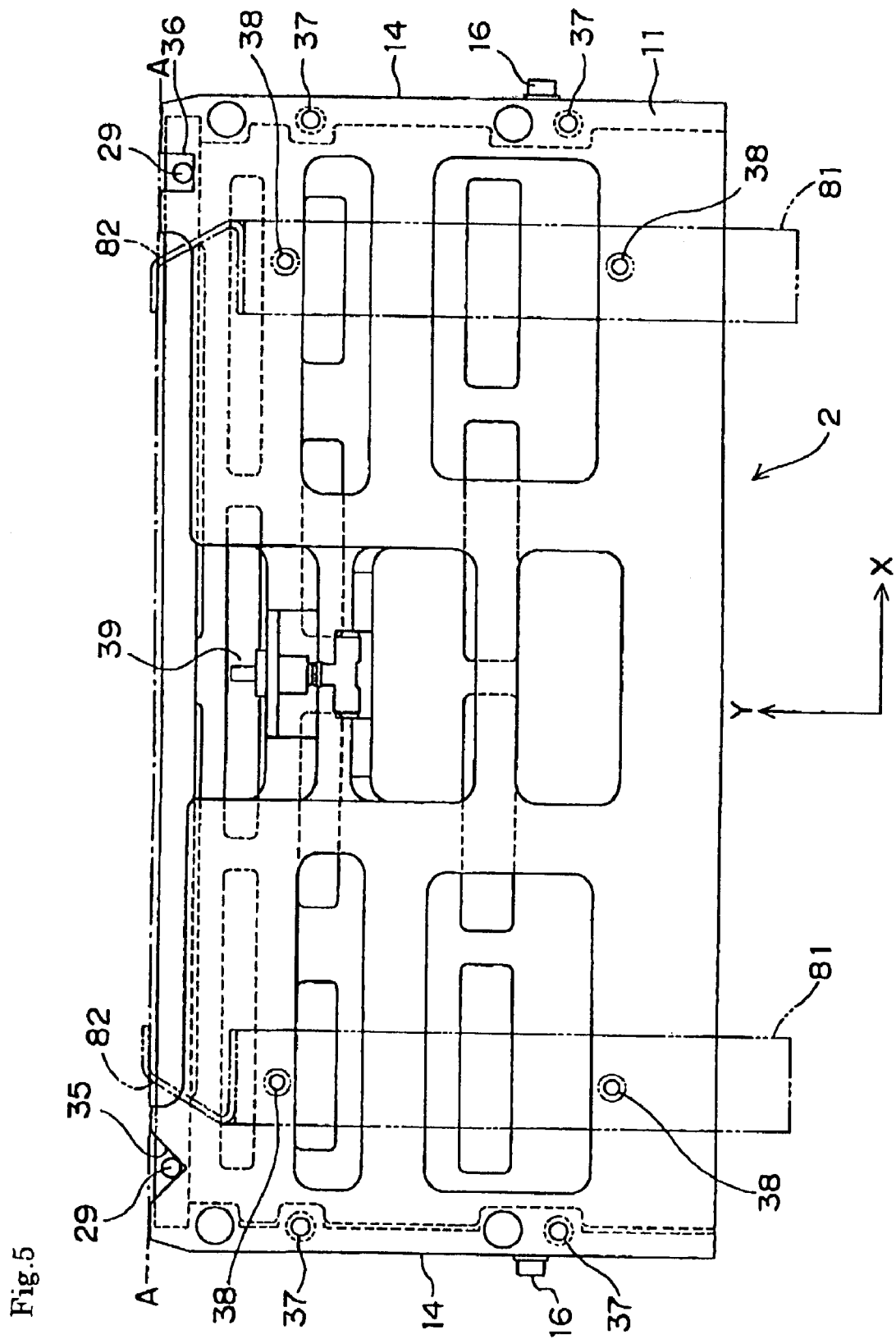
FIG. 5 is a bottom view of the component supply unit shown in FIG. 2.

FIG. 5 shows a bottom view of the component supply unit 2 for simultaneous changing. A stopper bolt 16 is provided on each of a pair of vertical surfaces 14 located at both ends of the base plate 11 in an X direction of this figure. This stopper bolt 16 serves as an element of guide mechanism for positioning the component supply unit 2 onto the fixing device 4. A chained line A—A shows a blocking wall located at the component mounting apparatus 1. A V-shaped slot 35 is formed in the vicinity of one end of the component supply unit 2 in an X direction, and a square shaped slot 36 is formed in the vicinity of another end thereof, respectively, both of which face the blocking wall. Both slots 35 and 36 engage with positioning pins 29 provided on the fixing device 4, and position the component supply unit 2 in both X and Y directions. Four positioning holes 38 are used for positioning component supply unit 2 when the component supply unit 2 is mounted on the cart 3. This will be described later. The air joint 39 of the component supply unit 2 is to be connected to the air joint 23 provided on the fixing device 4 when the component supply unit 2 is fixed to the component mounting apparatus 1 for supplying air to the component supply unit 2. Introduced air is guided to the air joint 19 mentioned above (see FIG. 2), and then supplied to each cassette 7.

A pair of holding arms 81 shown by double-dashed lines in FIG. 5 are elements of the cart 3 for holding the component supply unit 2 while it is mounted on the cart 3. A guide slope 82 is provided at one end of each holding arm 81. When the cart 3 is moved forward in the Y direction for installing the component supply unit 2 onto the component mounting apparatus 1, the guide slopes 82 and the guide roller 32 mentioned above jointly work for regulating movement of the cart 3 in the X direction. Four fixing holes 37 may be used for permanently fixing the component supply unit 2 by screwing bolts as mentioned above. The component supply unit 2 may be fixed with bolts if changing component supply unit 2 at a setup time is not required, and only cassettes 7 are changed while the component supply unit 2 is being fixed to the component mounting apparatus 1.

Figure 6:
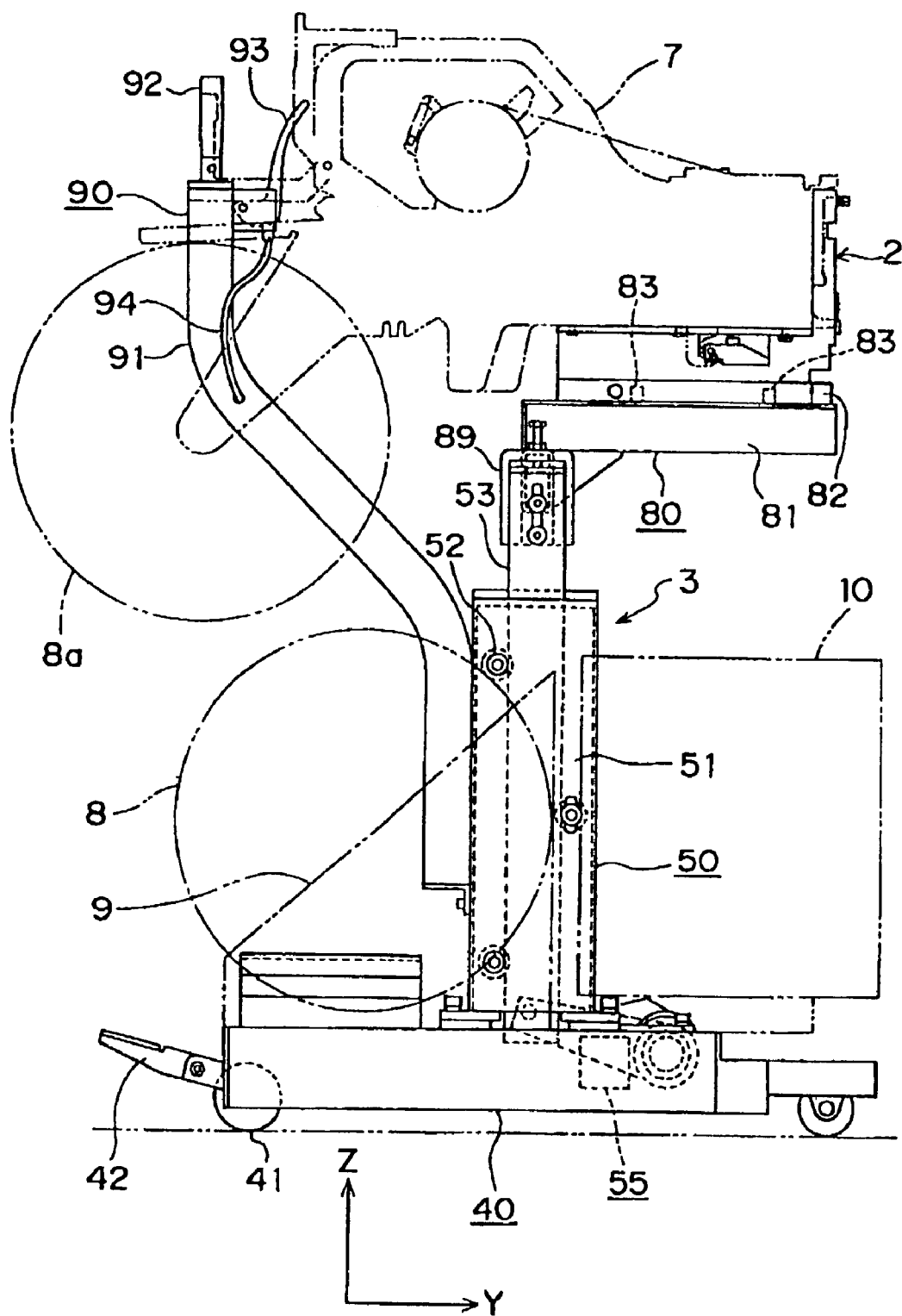
FIG. 6 is an side elevational view of one embodiment of a cart for changing a component supply unit according to the present invention.
Figure 9:
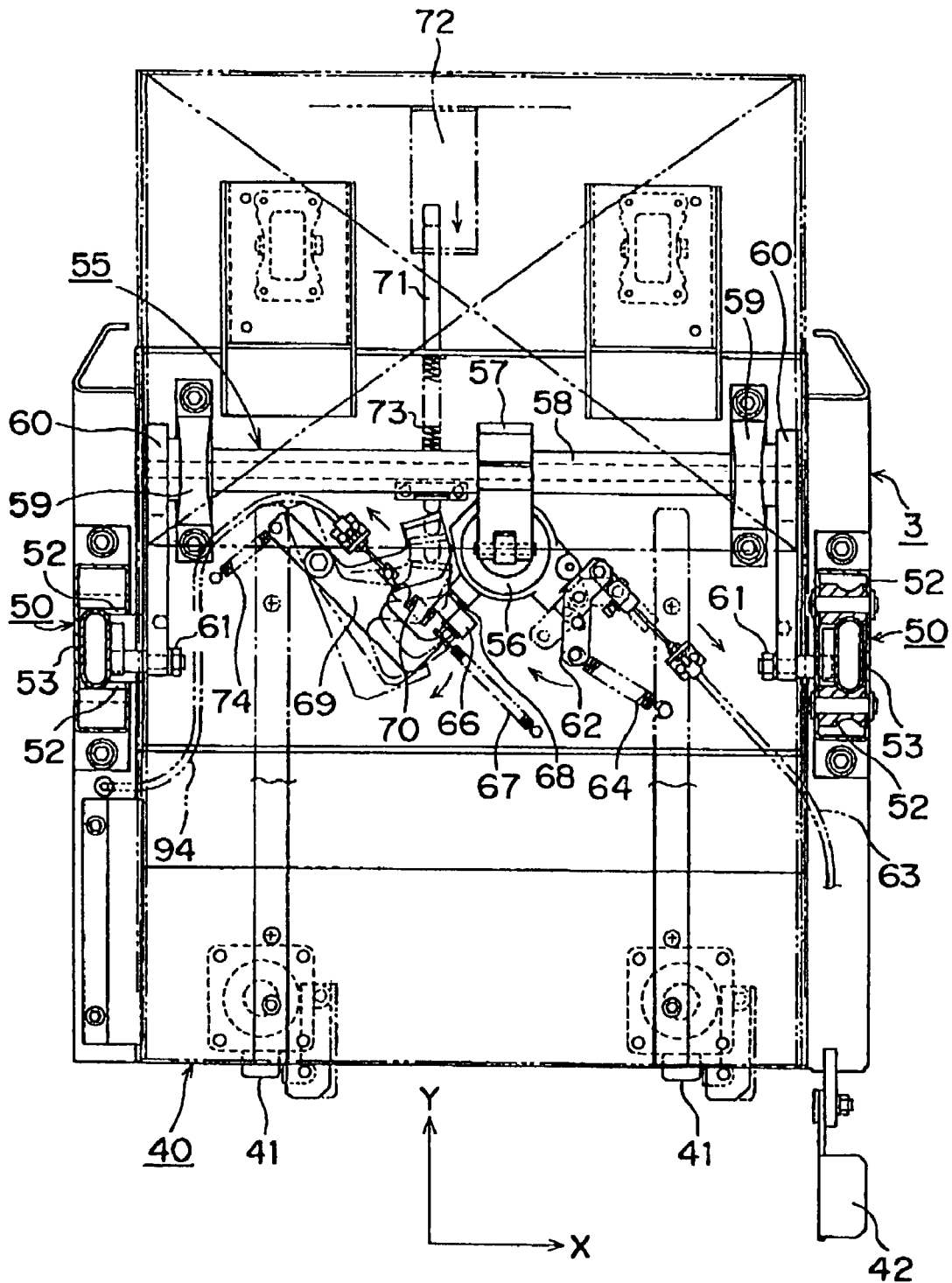
FIG. 9 is a cross sectional plan view of a cart for changing a component supply unit shown in FIG. 6.
Figure 10:
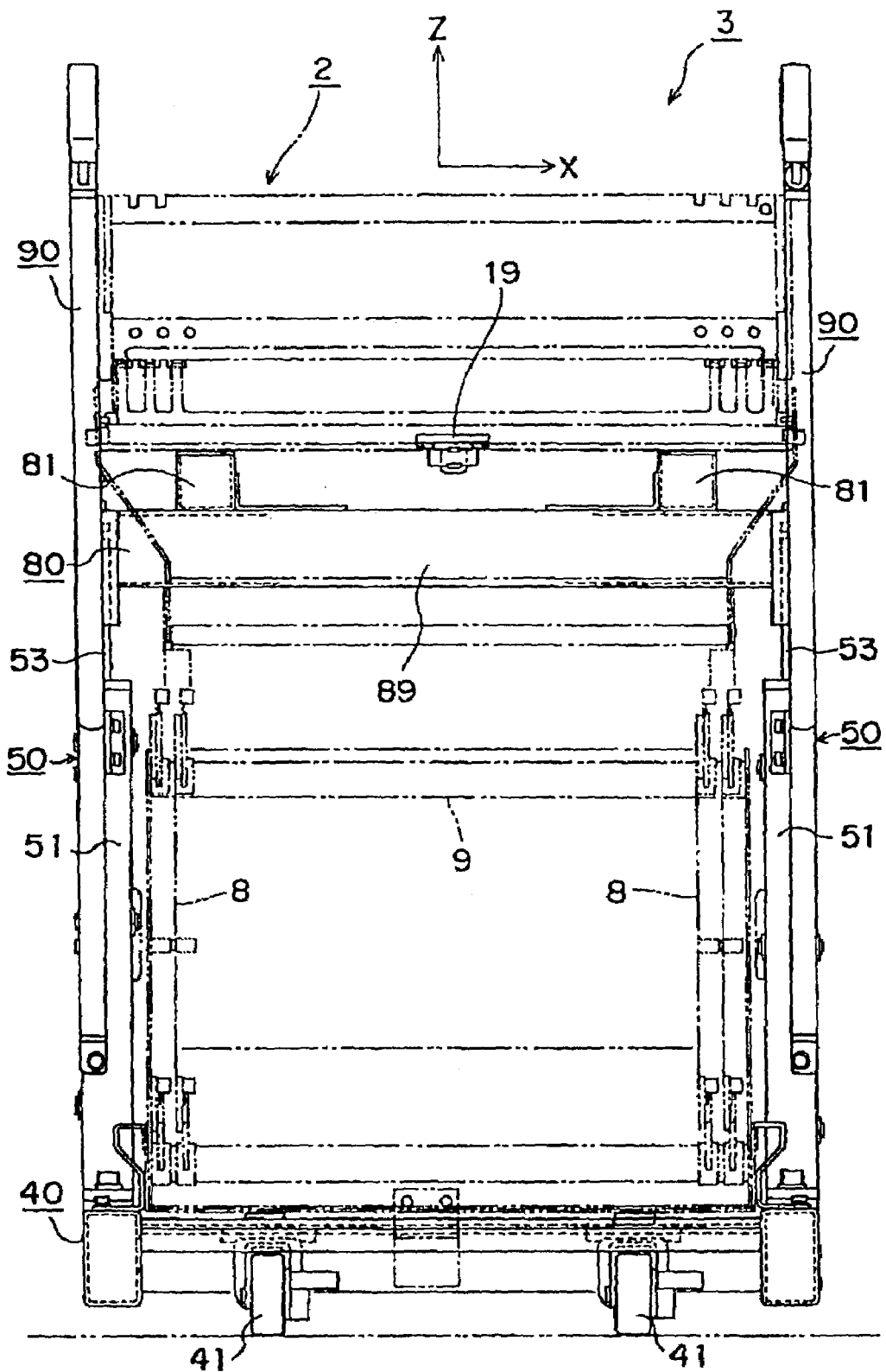
FIG. 10 is a front elevational view of a cart for changing a component supply unit shown in FIGS. 6 and 9.

Now, structure of the cart 3 according to the present embodiment is described by referring to appended drawings. FIG. 6 to FIG. 12 show details of the cart 3, wherein FIG. 6 shows a side elevational view, FIG. 9 shows a plan view, and FIG. 10 shows a front elevational view. Referring to FIG. 6, the cart 3 mainly includes a base frame 40, a pair of lifters 50, a driver 55, a holder 80, and a pair of handles 90. The component supply unit 2 holding a plurality of cassettes 7 may be mounted on the holder 80. The base frame 40 comprises a trolley with four wheels including two caster wheels. A pedal 42 is provided on the base frame 40 for operating the lifters 50.

Each lifter 50 mainly includes a supporting frame 51 (only one supporting frame 51 is seen in FIG. 6) firmly fixed to the base frame 40, elevating rod 53 (same as above) movable vertically in both ways in a Z direction of this figure, and at least three guide rollers 52 for each elevating rod 53 to movably hold the rod 53. The driver 55, shown by broken lines, for driving the lifters 50 is located inside the base frame 40. At least three guide rollers 52 are rotatably fixed to the supporting frame 51 and movably hold the elevating rod 53 from both sides in a Y direction of FIG. 6. When the number of the guide rollers 52 is three, these guide rollers 52 should be allocated on both sides of the elevating rod 53 in a zigzag manner, or have a distance among each other in the Z direction so as to restrict movement of the elevating rod 53 in the Y direction. When the number of the guide rollers 52 is four, two rollers 52, for example, may be allocated at an upper portion and the other two rollers 52 may be allocated at a lower portion of the rod 53, while each set of two rollers 52 face each other in the Y direction of this figure.

In FIG. 6, the holder 80 is fixed to a pair of the elevating rods 53 of the lifters 50. The holder 80 mainly includes a connecting bar 89 extending perpendicularly to this figure so as to connect a pair of the elevating rods 53 to each other, and a pair of the holding arms 81 (only one of them can be seen in FIG. 6) fixed to the connecting bar 89 and extending roughly horizontally in the Y direction of the figure. Two positioning pins 83 are attached to each of upper surfaces of both holding arms 81. These positioning pins 83 fit into positioning holes 38 formed on a bottom of the base plate 11 of the component supply unit 2 for positioning the component supply unit 2 on the holding arms 81. The cassettes 7 held by the component supply unit 2 may be either traditional type (i.e., a type having a reel 8a at an upper position), or a modified type whose reel 8 may be accommodated in the reel box 9 provided on the cart 3 of the present embodiment. These reels 8 and 8a are heavy, since a component supplying tape carrying many components are wound around the reel 8 or 8a, as mentioned above. Accordingly, as clearly understood by FIG. 6, it is preferable to use cassette 7 whose reel 8 may be accommodated in the reel box 9 so as to lower a center of gravity of the component supply unit 2, and to reduce an amount of extension of the reel 8 for easier handling of the cart 3.

A pair of the handles 90 (only one of which can be seen in FIG. 6) is provided on the cart 3 for easier handling and lifting or lowering of the lifters 50. Each handle 90 includes a hand frame 91 and a folding handle 92 at its one end. A grip 93, attached to the hand frame 91 is used for pulling a release wire 94 to release hydraulic pressure of a hydraulic jack, and to lower the component supply unit 2 mounted on the cart 3. The collecting box 10, shown by a double-dashed line may be used for collecting used component supplying tapes.

Figure 7:
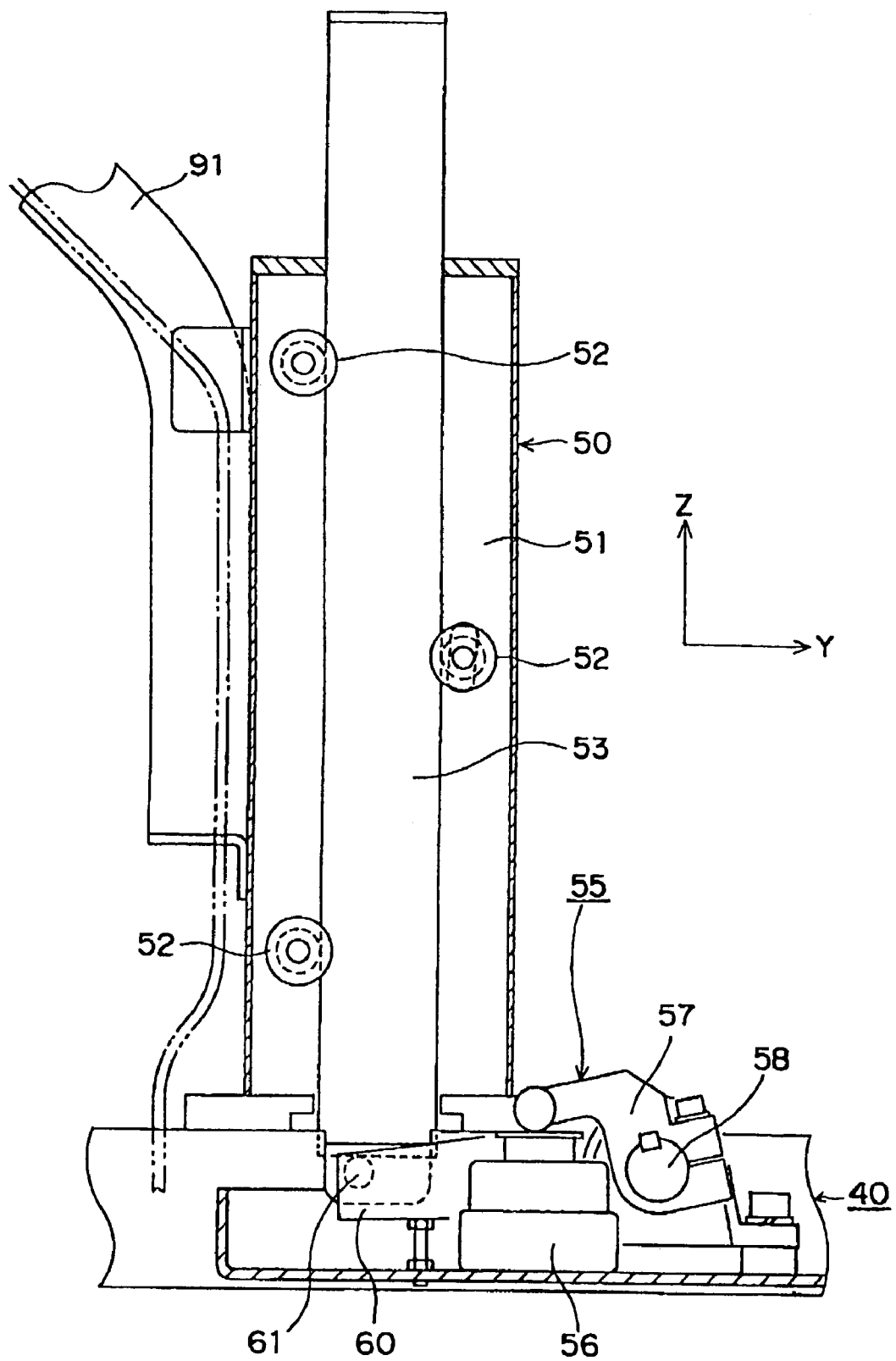
FIG. 7 is an fragmentary enlarged cross sectional side view of a cart for changing a component supply unit shown in FIG. 6

FIG. 7 is a side elevational view in an enlarged fragmentary cross section which shows relationships between the lifters 50, fixed to the base frame 40, and the driver 55. The driver 55 mainly comprises a hydraulic jack 56 fixed to the base frame 40, a jack side lever (first lever) 57 for changing an axial movement of the hydraulic jack 56 into a circular movement, a shaft 58 to hold the jack side lever 57 for rotation, a pair of rod side levers (second levers) 60 also held by the shaft 58 so as to transfer circular movement of the jack side lever 57 to a pair of elevating rods 53 for upward and downward movement. As shown in this figure, by making a lever length of the rod side levers 60 longer than a lever length of the jack side lever 57, axial movement of the hydraulic jack 56 may be transferred to the elevating rods 53 in an expanded manner. Due to this expansion, a compact hydraulic jack with a short stroke may be employed, and hence, the hydraulic jack 56 may be accommodated inside the base frame 40. Arm lengths of both levers 57 and 60, though, may be arranged in any combination. An elevating pin 61 is fixed to each of the rod side levers 60, with which a lower end of the elevating rod 53 makes contact.

Figure 8:
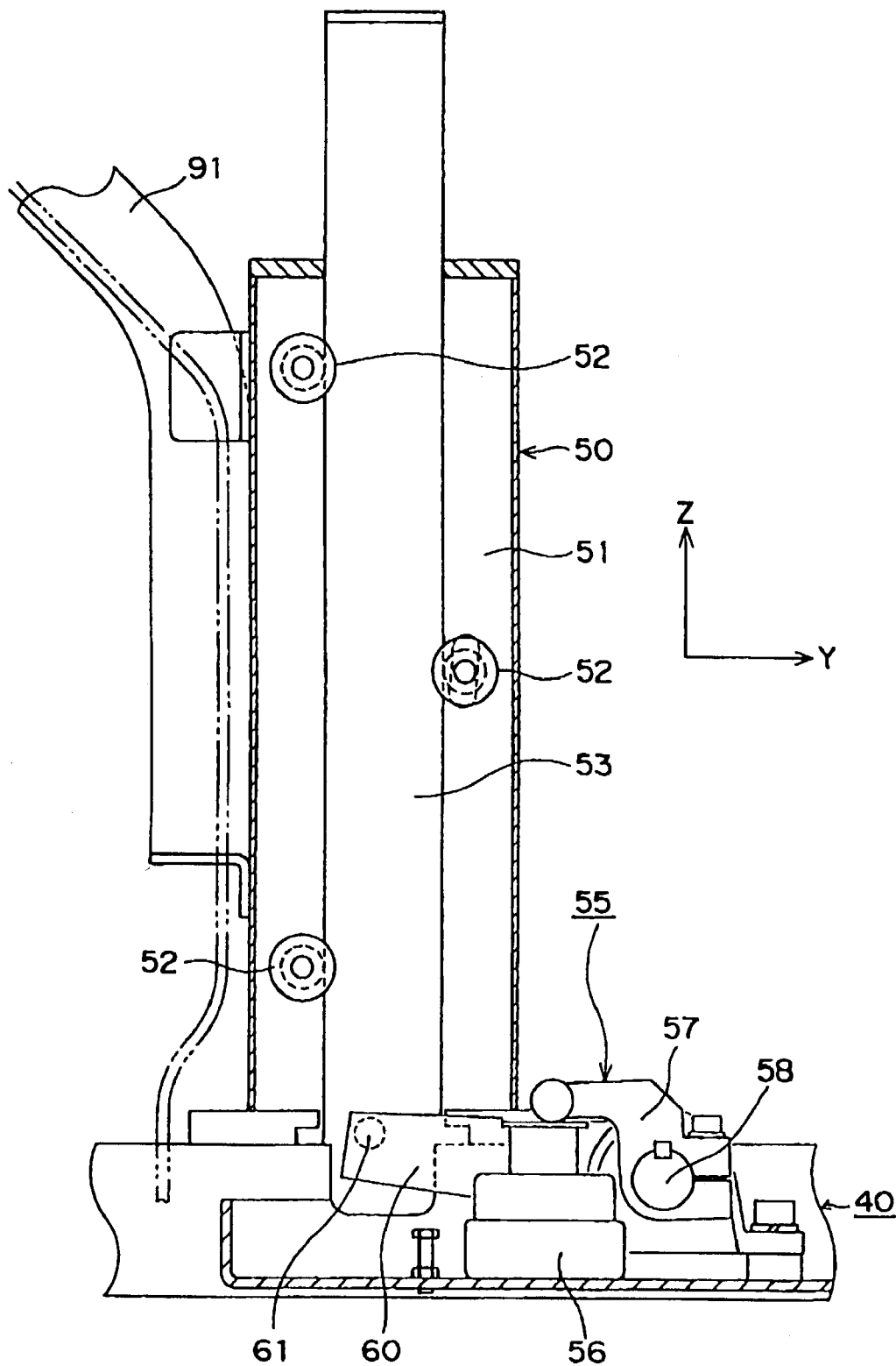
FIG. 8 is an fragmentary enlarged cross sectional side view of a cart for changing a component supply unit shown in FIG. 6, showing a different stage from that of FIG. 7.
Figure 18:
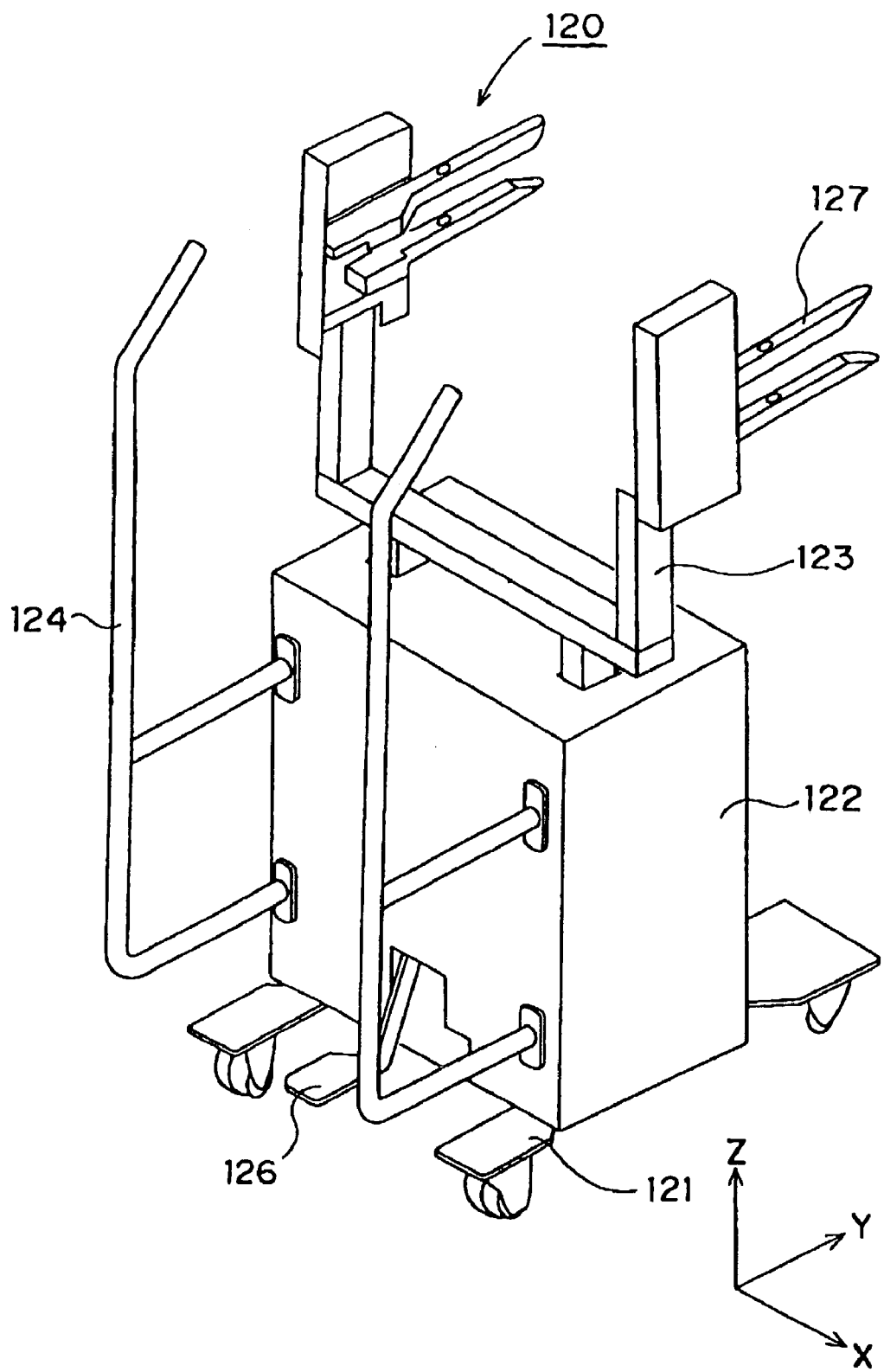
FIG. 18 is a perspective view of a cart for changing a component supply unit of prior art.
Figure 19:
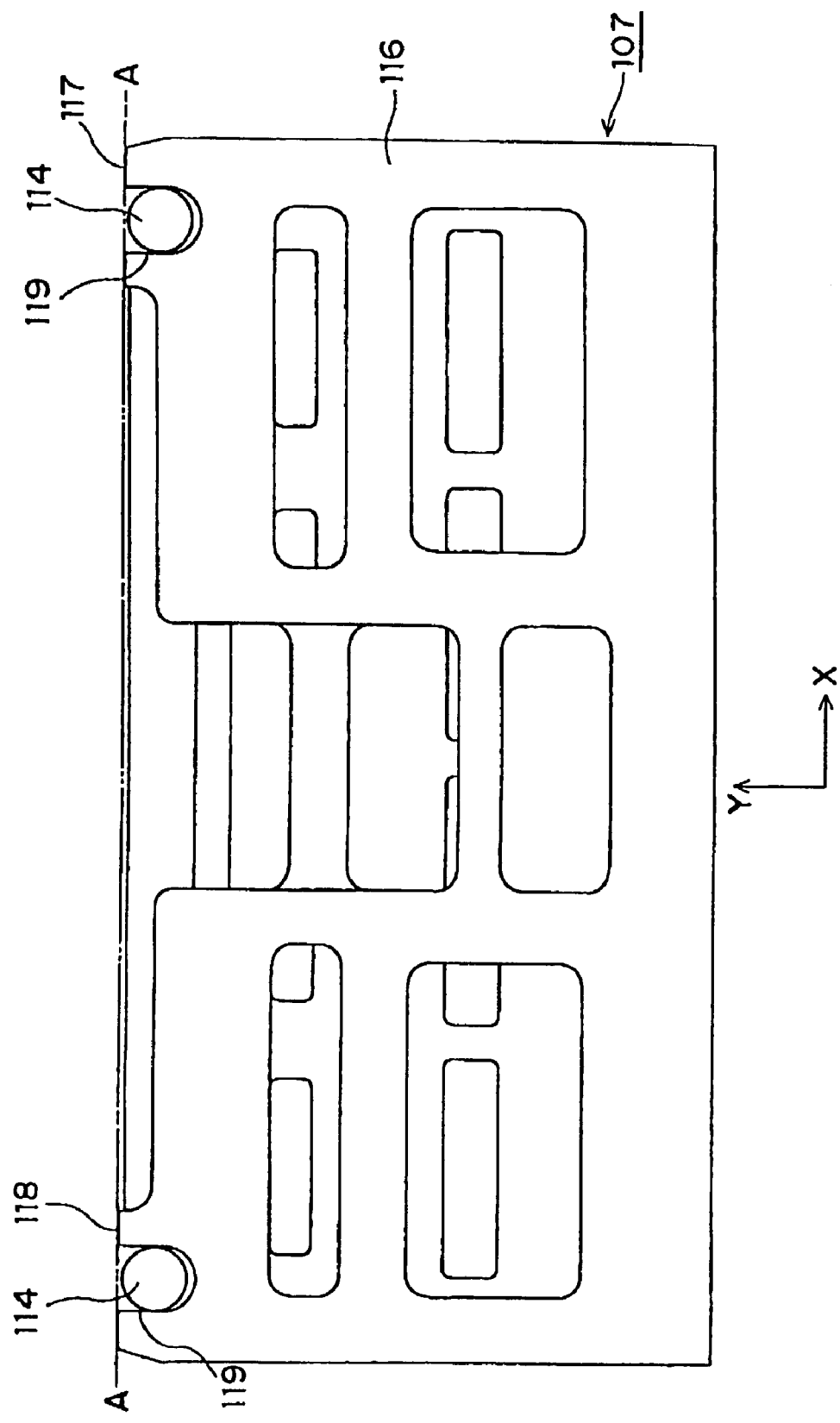
FIG. 19 is a bottom view of a component supply unit of prior art.

FIG. 8 shows the elevating rod 53 when it is lifted up by the elevating pins 61 due to extension of the hydraulic jack 56 and movement of other elements of the driver 55. In prior art, since a lifter is operated directly by an output shaft of a hydraulic jack, a relatively large hydraulic jack is needed in order to obtain a necessary stroke. Moreover, since the lifter is located at a central portion of the cart 3, the driver and the lifter occupy most of space in the central portion of the cart 3 (see FIG. 18). As for the driver 55 of the cart according to the present embodiment, to the contrary, short stroke hydraulic jack 56 may be accommodated inside the base frame 40, and movement of the hydraulic jack is transferred to a pair of the rod side levers 60 located at both side ends of the cart 3 via the shaft 58. The rod side levers 60 lift up a pair of elevating rods 53, respectively, which are also located at both side ends of the cart 3. Due to this arrangement, a wide space with no obstacles may be obtained in a central portion of the cart 3 surrounded by the base frame 40, a pair of the lifters 50, and the holder 80.

FIG. 9 is a plan view of the cart 3. The above-described arrangement may be seen more clearly in this drawing. Upper side of a Y direction of this figure faces the component mounting apparatus 1. The hydraulic jack 56 is seen in a center of the figure, but is accommodated inside the base frame 40 and is operable in upward and downward directions perpendicular to the drawing. As mentioned above, the hydraulic jack of the prior art operates upward and downward at the central portion of the cart so as to directly move the component supply unit 2. Most of the central portion of the cart, therefore, is used for the hydraulic jack as well as other driving elements. Consequently, utility space is hardly available in such an arrangement. According to the cart 3 of the present invention, to the contrary, axial movement of the hydraulic jack is converted into a circular movement of the jack side lever 57. This circular movement is then transferred, via the shaft 58, to the rod side levers 60 located at both side ends of an X direction of the figure in an expanded manner. Then, the elevating pins 61 fixed to the rod side levers 60 simultaneously lift up a pair of the elevating rods 53. In other wards, by accommodating the hydraulic jack 56 in small size inside the base frame 40, and by relocating elevating rods 53 for lifting the component supply unit 2 from the central portion to both side ends of the cart 3, the cart 3 according to the present embodiment makes it possible to provide an area above the base frame 40 of FIG. 9 for a utility space. A pair of bearings 59 are provided for rotatably supporting the shaft 58 at both its ends.

Operation of the hydraulic jack 56 is now described by referring to FIG. 9. The hydraulic jack 56 has a lifting lever 62 for extending an operation shaft of the hydraulic jack 56. One end of the lifting lever 62 is connected to a pedal 42 via a lifting wire 63. Another end of the lifting lever 62 is connected to a return spring 64 which provides a return force to the lifting lever 62.

As for retracting, or shortening the operation shaft of the hydraulic jack 56, a release lever 66 is connected to the shaft 68, which operates a hydraulic pressure release valve inside the hydraulic jack 56. The release lever 66 is always pulled by a block spring 67, so as to block movement of the release lever 66 and maintain hydraulic pressure of the hydraulic jack 56. Further, one end of the release wire 94, shown by double-dashed lines in FIG. 9, is connected to the release lever 66. Another end of the release wire 94 is connected to the grip 93 attached to the hand frame 91 (see FIG. 6) for releasing operation of hydraulic pressure of the hydraulic jack 56 by an operator. A control lever 69 is also provided for the hydraulic jack 56 at a hydraulic pressure releasing side. Depending on position of the control lever 69, a hydraulic pressure releasing operation is prevented even when the operator grasps the grip 93 for releasing pressure. An absorbing spring 70 is provided as a part of the release wire 94 at the vicinity of its one end near the release lever 66. This absorbing spring 70 absorbs a pulling force of a grip operation by elastic extension of its length. Detail of this mechanism will be explained later.

The control lever 69 is driven by a control shaft 71 which is also attached to the base frame 40 at an upper side of a Y direction in FIG. 9 facing the component mounting apparatus 1. When the cart 3 is moved close to the component mounting apparatus 1 at the upper side of the Y direction of this figure, an upper end of the control shaft 71 is pushed back by a control bracket 72, shown by double-dashed lines, provided on the component mounting apparatus 1. When the cart 3 is separated from the component mounting apparatus 1, on the other hand, a control spring 73 pushes the control shaft 71 back to its original extended position. Also, the return spring 74 moves the control lever 69 back to its original position. These mechanisms will be explained in detail later.

FIG. 10 shows a front elevational view of the cart 3. Referring to this figure, a wide space in a central portion of the cart 3 surrounded by the base frame 40, a pair of the lifters 50 located at both side ends of the base frame 40 in an X direction of the figure, and the holder 80 connecting both lifters 50 together may clearly be seen. A pair of the handles 90 is also fixed to both lifters 50, respectively. The holder 80 mainly includes a connecting bar 89 connecting two of the elevating rods 53 together, and a pair of holding arms 81 fixed to the connecting bar 89 for mounting the component supply unit 2. Double-dashed lines in the figure show the component supply unit 2 mounted on the holder 80, reels 8 located at lower positions of the cassettes 7, and a reel box 9 provided in the central space of the cart 3 for accommodating the reels 8.

Now, operation of the cart 3 for mounting the component supply unit 2 structured as above is described by referring to appended drawings. Referring to FIG. 9, when an operator pushes the pedal 42, the lifting lever 62 rotates via lifting wire 63, and the hydraulic jack 56 extends. Since the lifting lever 62 may return to its original position by virtue of the return spring 64, a plurality of pedal operations may be performed so as to extend the hydraulic jack 56 up to a desired length. This extension of the hydraulic jack 56 is transferred to the shaft 58 via the jack side lever 57, and rotation of the shaft 58 is then transformed into vertical movement of a pair of the rod side levers 60 in an expanded manner. This vertical movement is then transferred to a pair of the elevating rods 53 located at both side ends of the X direction of FIG. 9 via elevating pins 61 attached to rod side levers 60.

Figure 11A:
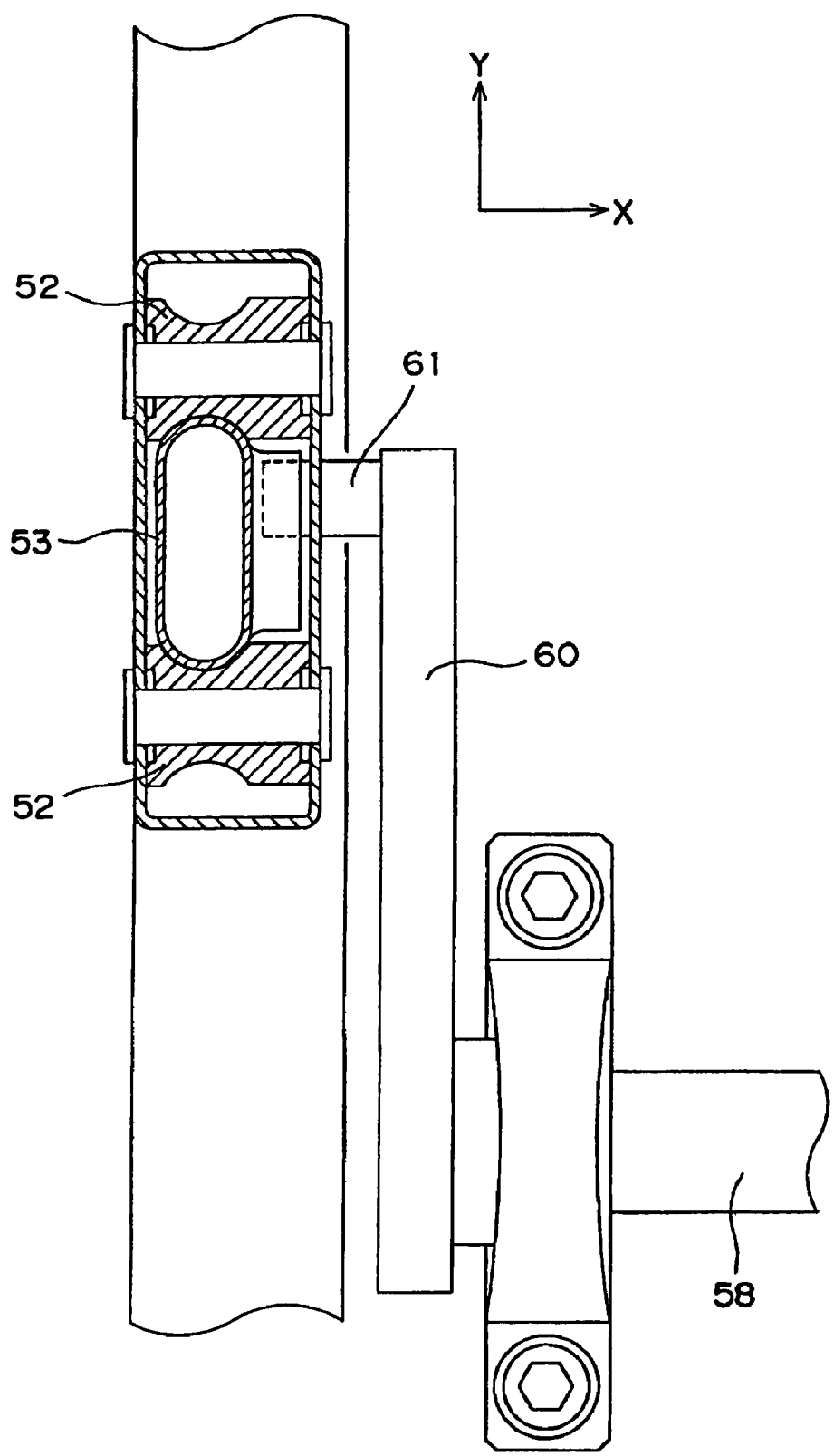
FIG. 11(A) is a fragmentary enlarged plan view of a cart for changing a component supply unit shown in FIG. 9.

In the present embodiment, each of the elevating rods 53 is made of a deformed pipe whose cross section across its longitudinal axis is deformed into a flat circle. This elevating rod 53 having a flat circular cross section is movably supported by at least three guide rollers 52, which are rotatably fixed to the supporting frame 51. FIG. 11(A) shows detail of this structure. Each of the guide rollers 52 has a dent on its circumference as shown in its cross section in FIG. 11(A). The guide rollers 52 prevent the elevating rod 53 from moving in an X direction of this figure by engaging the dent with a protruding portion of the flat circular cross section of the elevating rod 53. Further, since the guide rollers are arranged to hold the elevating rod 53 from both sides of the protruding portions of its flat circular cross section, the guide rollers 52 prevent the elevating rod 53 from moving in a Y direction as well. Since all these guide rollers 52 are rotatably fixed, they support the elevating rod 53 in such a manner that the elevating rod 53 may move up and down in a vertical direction, while its movements in X and Y directions are restricted.

Figure 11B:
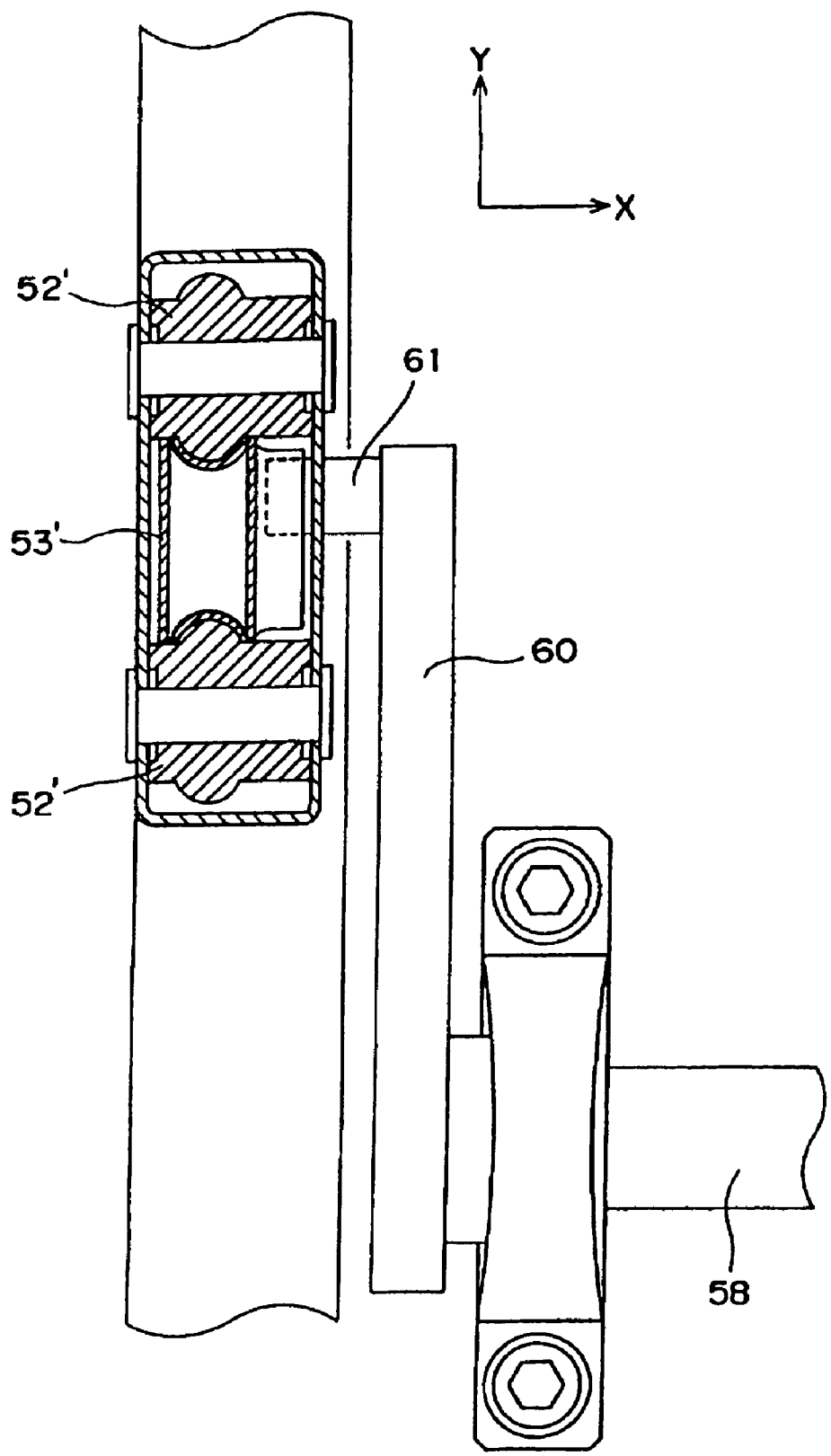
FIG. 11(B) is a fragmentary enlarged plan view of a modified cart for changing the component supply unit shown in FIG. 9.

The cross section of the elevating rod 53 is not limited to the flat circle as shown in FIG. 11(A), but it may be elliptical, or circular so long as the dent formed on the circumferences of the guide rollers 52 may engage with a surface of elevating rod 53, and thereby prevent movement of the elevating rod 53 in the X direction. Alternatively, as shown in FIG. 11(B) the cross section of guide rollers 52' may have a protrusion on its circumference, and a channel may be formed on a surface of elevating rod 53' in an axial direction so that these protrusions of the guide rollers may engage with the channel of the elevating rod 53' for preventing movement of the elevating rod 53' in X and Y directions. In general, the cross sections of the elevating rod 53, 53' and the guide rollers 52, 52' may be formed in such a way that a first engagement portion is formed on the outer surface of the elevating rod and a second engagement portion is formed on the circumference of the guide roller, and the first and the second engagement portions may engage with each other so that the guide rollers restrict movement of the elevating rod in both X and Y directions, while the guide rollers permit vertical movement (movement in the Z direction) of the elevating rod.

Referring back to FIG. 9, by a series of operations starting from pushing the pedal 42 by the operator, the driver 55 lifts up both elevating rods 53 of the lifters 50, the holder 80 fixed to the elevating rod 53, and the component supply unit 2. Since the base frame 40 of the cart 3 has wheels including caster wheels 41, the operator can easily move the cart 3 back and forth for maneuvering it.

Next, an operation for lowering the lifter 50, after being lifted up as mentioned above, is described. First, an operator grasps the grip 93 attached to the handle frame 91 (see FIG. 6) for operating the release lever 66 of the hydraulic jack 56 shown in FIG. 9 via the release wire 94. By this operation, the shaft 68, which is connected to the hydraulic pressure release valve, rotates, and hence hydraulic pressure is released which, in turn, retracts or shortens extended hydraulic jack 56. Due to this retraction of the hydraulic jack 56, the elevating pins 61, holding the elevating rod 53 at an upper position, loose their supporting forces, and the holder 80 and component supply unit 2 mounted on the holder 80 are lowered by their own weight.

Figure 12A:
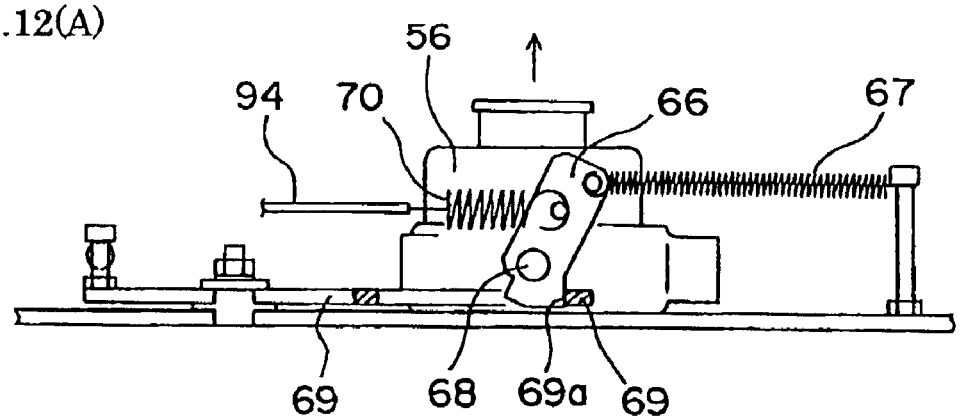
Figure 12B:
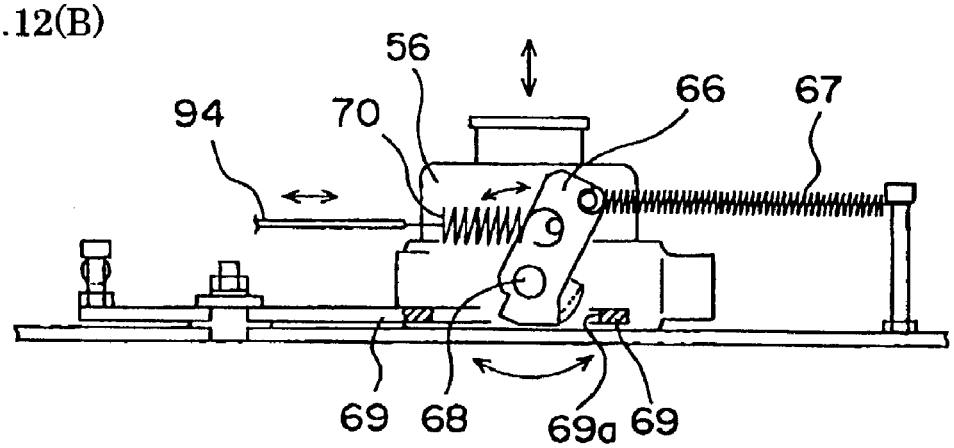
Figure 12C:
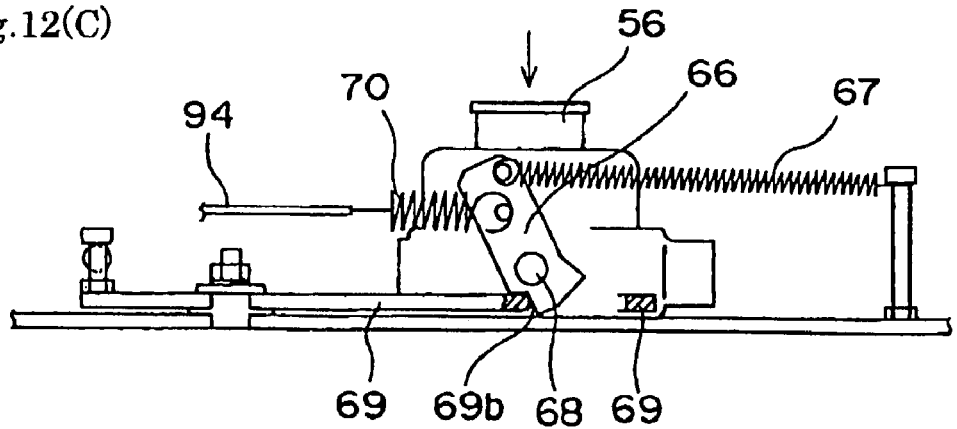

Now, movement of components related to the control lever 69, which controls and restricts movement of the release lever 66, is described by referring to the appended drawings. In FIG. 9, the control shaft 71 attached to the cart 3 moves the control lever 69 in three different stages when the control shaft 71 is being pushed by the bracket 72 provided on the component mounting apparatus 1. FIG. 12(A) to FIG. 12(C) illustrate these three different stages. Each of these figures shows a position viewed from a front of the release lever 66 attached to the hydraulic jack 56. The release lever 66 is fixed to the shaft 68 which operates the hydraulic pressure release valve inside the hydraulic jack 56, and the release lever 66 may rotate both in clockwise and counterclockwise directions. The release lever 66 is normally pulled by the block spring 67 to prevent hydraulic pressure from releasing (clockwise direction in these figures). The block spring 67 is shown on the right hand side of the drawing. On an opposite side of the drawing, the release wire 94, when pulled by the operator with a force overcoming a spring force of the block spring 67, may move the release lever 66 in a direction for releasing hydraulic pressure (counterclockwise direction). Further, one end of the release lever 66 engages control lever 69 which may restrict movement of the release lever 66 depending on the stages.

FIG. 12(A) shows a stage where the cart 3 is completely separated from the component mounting apparatus 1. In this stage, the control shaft 71 shown in FIG. 9 is fully extended by virtue of the control spring 73. In such a situation, the control lever 69 blocks movement of the release lever 66 of the hydraulic jack 56 so that the hydraulic pressure release valve is kept in a closed position. More precisely, first engaging portion 69a, or one end of a slot formed in the control lever 69, contacts with a portion of the release lever 66 for blocking counterclockwise rotation of the release lever 66. Under such condition, even when the release wire 94 is pulled by the operator toward the left in this figure, the release lever 66 may not be moved because of the blocking mechanism mentioned above. An operator's pulling force of the release wire 94 is absorbed by extension of the absorbing spring 70. This is a mechanism to avoid a risk of rapid descending of a lifted up component supply unit 2 by an operator's erroneous operation of releasing hydraulic pressure when the cart is separated from the component mounting apparatus 1. The absorbing spring 70 prevents damage of related components in case the operator attempts to move the release lever 66 forcibly under such blocking condition.

FIG. 12(B) shows a stage where the cart 3 approaches the component mounting apparatus 1, and the control shaft 71 comes into contact with the control bracket 72 (see FIG. 9) provided on the component mounting apparatus 1, and the control shaft 71 is pushed backward one step. With this contact of the control shaft 71, the control lever 69 is moved one step toward the right in this figure. As a result of this movement, blocking of rotation of the release lever 66 by the first engaging portion 69a of the control lever 69 is released, i.e., counterclockwise rotation of the release lever 66 becomes possible. In case the operator operates the grip 93 for pulling the release wire 94 toward the left in the figure, the release lever 66 rotates counterclockwise, and hydraulic pressure of the hydraulic jack 56 is released, thereby the elevating rods 53 are lowered. This movement permits the component supply unit 2 to be placed on the fixing device 4 of the component mounting apparatus 1, which will be further described later. In case the operator does not grasp the grip 93 and the release wire 94 is not pulled, the release lever 66 is kept in the same position for maintaining hydraulic pressure by virtue of the block spring 67.

FIG. 12(C) shows a stage where the cart 3 is completely pushed forward to the component mounting apparatus 1. Under this condition, the control shaft 71 (see FIG. 9) is fully pushed backward by the control bracket 72 provided on the component mounting apparatus 1. By this movement of the control shaft 71, the control lever 69 is moved further toward the right in this figure. By this movement, a second engaging portion 69b, or another end of the slot formed in the control lever 69, contacts a portion of the release lever 66, thereby clockwise rotation of the release lever 66 is blocked. Further, the release lever 66 is forced to rotate counterclockwise, by overcoming a spring force of the block spring 67, and the release lever 66 is locked at that position. Consequently, hydraulic pressure of the hydraulic jack 56 is released, and therefore, the elevating rods 53 of the lifters 50 are lowered and kept in a lowered position. Under this condition, even if the operator operates the pedal 42 for attempting to extend the hydraulic jack 56 erroneously, the elevating rods 53 will not be lifted up. This is a mechanism for avoiding a risk of damage against structural elements of the component mounting apparatus 1, such as component sucking nozzles, when the component supply unit 2 is erroneously lifted up while it is being installed on the fixing device 4 of the component mounting apparatus 1.

In the present embodiment, a distance between the component mounting apparatus 1 and the cart 3 is detected by using the control shaft 71, which is a simple structure of a contact type sensor, for controlling the release lever 66. Alternatively, the distance between the component mounting apparatus 1 and the cart 3 may be detected by using, for example, a perspective type sensor which detects distance by blocking infra-red radiation, or a response type sensor which radiates supersonic waves and detects reflected waves, and the like. The release lever 66 may also alternatively be controlled by using, for example, a solenoid which is operated based on signals transmitted from such sensors.

Next, operation of installing the component supply unit 2, mounted on the cart 3 as mentioned above, onto the fixing device 4 of the component mounting apparatus 1, and a guiding structure for positioning the component supply unit 2 are described by referring to the appended drawings. Referring to FIG. 4, the component supply unit 2, mounted on the holder 80 of the cart 3, is moved forward in the Y direction toward the fixing device 4 as shown by an arrow 30. In the present specification, moving direction toward the component mounting apparatus 1 as shown by the arrow 30 is called "forward". The component supply unit 2 is mounted on the holder 80 in such a way that the component supply unit 2 is placed on top of the holding arms 81 of the holder 80, with four positioning pins 83 attached to the holding arms 81 fit into the positioning holes 38 formed on the component supply unit 2 (see FIG. 5).

Under this condition, the elevating rods 53 are lifted up by operating the pedal 42 attached to the base frame 40, and the component supply unit 2 is held at a predetermined level of height while it is moved toward the component mounting apparatus 1 together with the cart 3. By this forward movement, the guide slopes 82 of the holding arms 81 shown on upper sides in the Y direction of FIG. 5 contact the guide rollers 32 provided on both arm plates 22 of the fixing device 4 shown in FIG. 4, respectively, and hence movement of the cart 3 in the X direction is restricted by the guide rollers 32. Under such restriction, the cart 3 is further moved forward until the stopper bolts 16 attached to both vertical surfaces 14 of the base plate 11 of the component supply unit 2 come into contact with the vertical stoppers 28 provided on both arm plates 22 of the fixing device 4, and hence further forward movement of the component supply unit 2 is once blocked.

Figure 13:
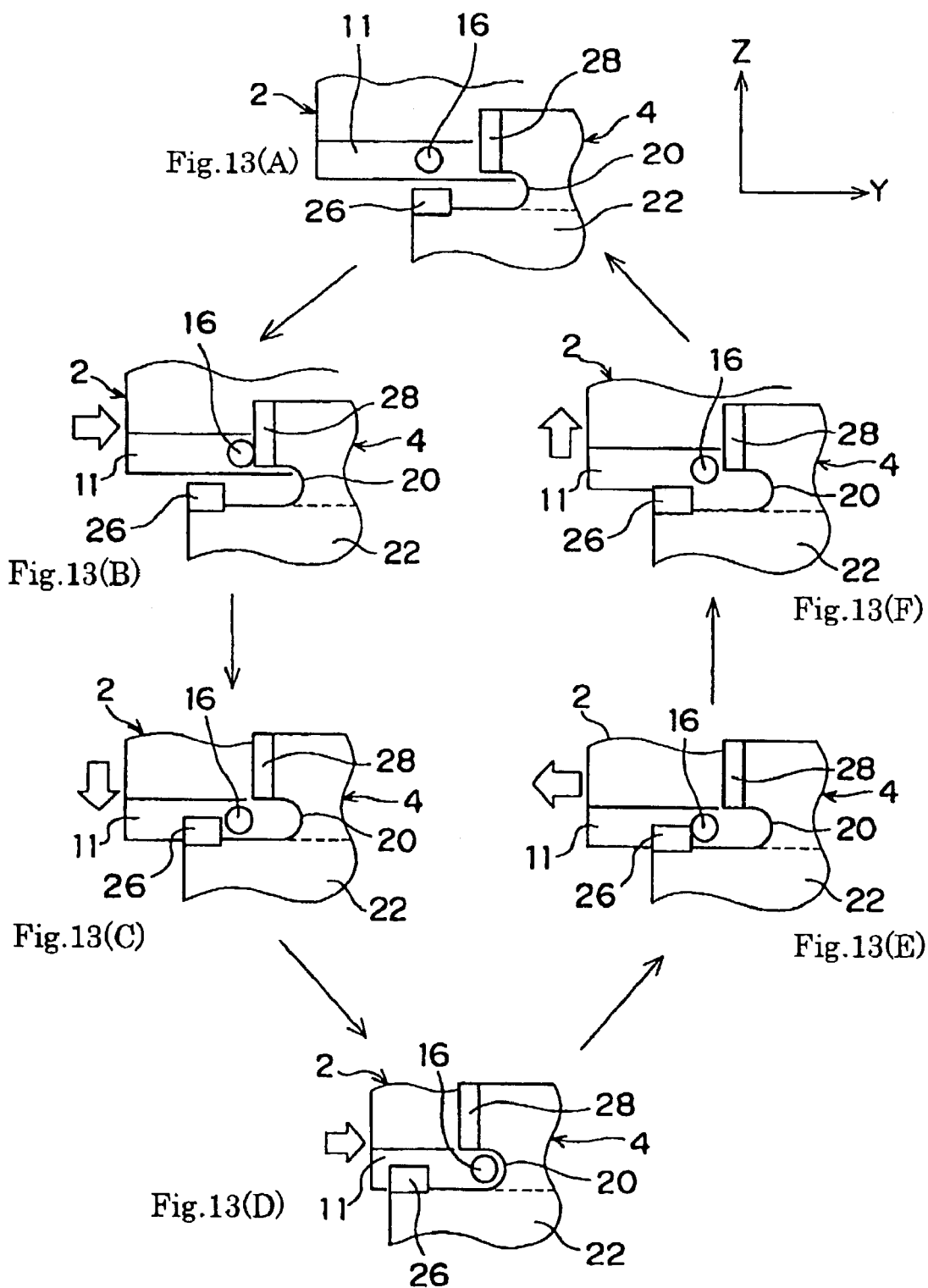

FIGS. 13(A) to 13(F) show relationships between the stopper bolts 16 and various stoppers provided on the arm plate 22 of the fixing device 4. First, as shown in FIG. 13(A), the stopper bolt 16 facing the arm plate 22 of the fixing device 4 is moved forward toward the fixing device 4 shown on the right side of a Y direction of this figure, and the stopper bolt 16 contacts the vertical stopper 28 in FIG. 13(B). At this position, aforementioned control shaft 71 is push backward one step (see FIG. 12(B)). As a result, a locking condition for maintaining hydraulic pressure of the hydraulic jack 56 is eliminated, thereby the component supply unit 2 may be lowered.

By an operator's operation for lowering the component supply unit 2, the stopper bolt 16 of the component supply unit 2 is lowered, and the bolt 16 fits into the slot 20, located at the right hand side in the Y direction, of the horizontal stopper 26 provided on each of the arm plates 22 of the fixing device 4. By this lowering operation of the component supply unit 2, both side end portions of the base plate 11 at the bottom of the component supply unit 2 are placed on horizontal guide surfaces 24 provided on both arm plates 22 (see FIG. 4). The component supply unit 2 is positioned in a predetermined horizontal direction at this stage.

When the component supply unit 2 is moved forward one step further (in the Y direction), the stopper bolt 16, as shown in FIG. 13(D), moves forward in the Y direction of this figure inside the slot 20 located beneath the vertical stopper 28. By this secondary movement of the component supply unit 2, positioning pins 29 attached to the end plate 21 of the fixing device 4 fit into the V shaped slot 35 and the square shaped slot 36, respectively (see FIG. 5), and contact portions defining these slots.

At this moment, as can be seen in FIG. 5, movement of the component supply unit 2 in both the Y direction (forward or backward directions) and the X direction (right and left directions) of FIG. 5 are restricted by virtue of one of the positioning pins 29 and the V shaped slot 35. At the same time, movement of the component supply unit 2 in the Y direction (forward or backward directions) is restricted by virtue of the other positioning pin 29 and the square shaped slot 36. By employing such positioning mechanism, a high level of accuracy for positioning may be achieved compared to a prior art mechanism using one or two U shaped slot(s). After the component supply unit 2 is positioned, the clamp switch 6 (see FIG. 1) is operated and the component supply unit 2 is clamped to the component mounting apparatus 1, and a changing of a plurality of cassettes 7, or component supply devices, may be completed at once.

Figure 14A:
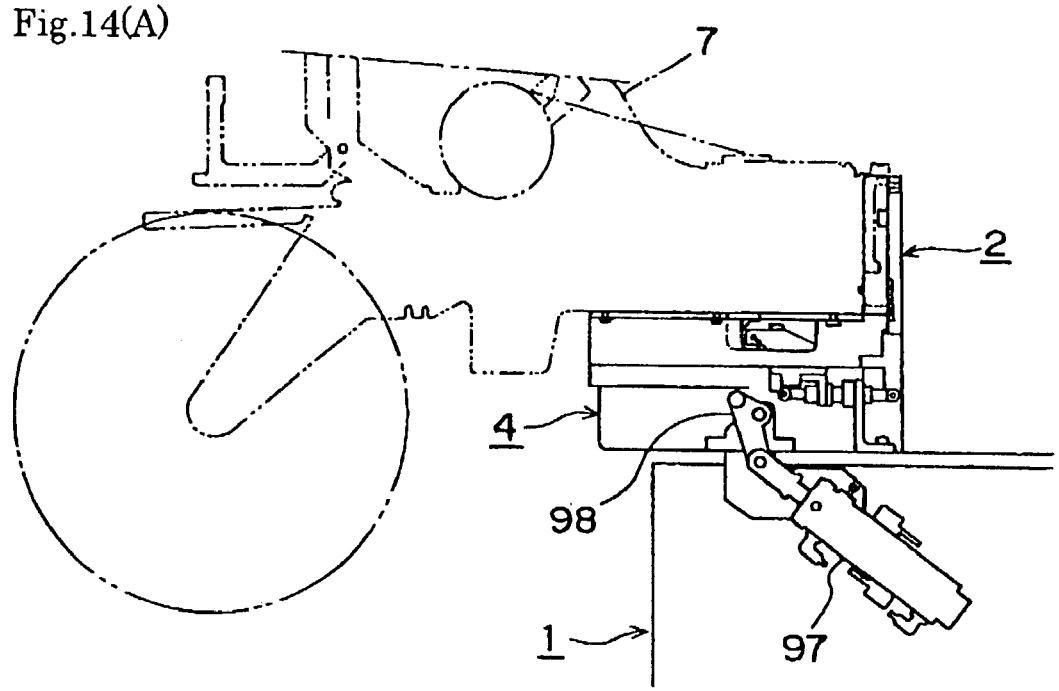
Figure 14B:
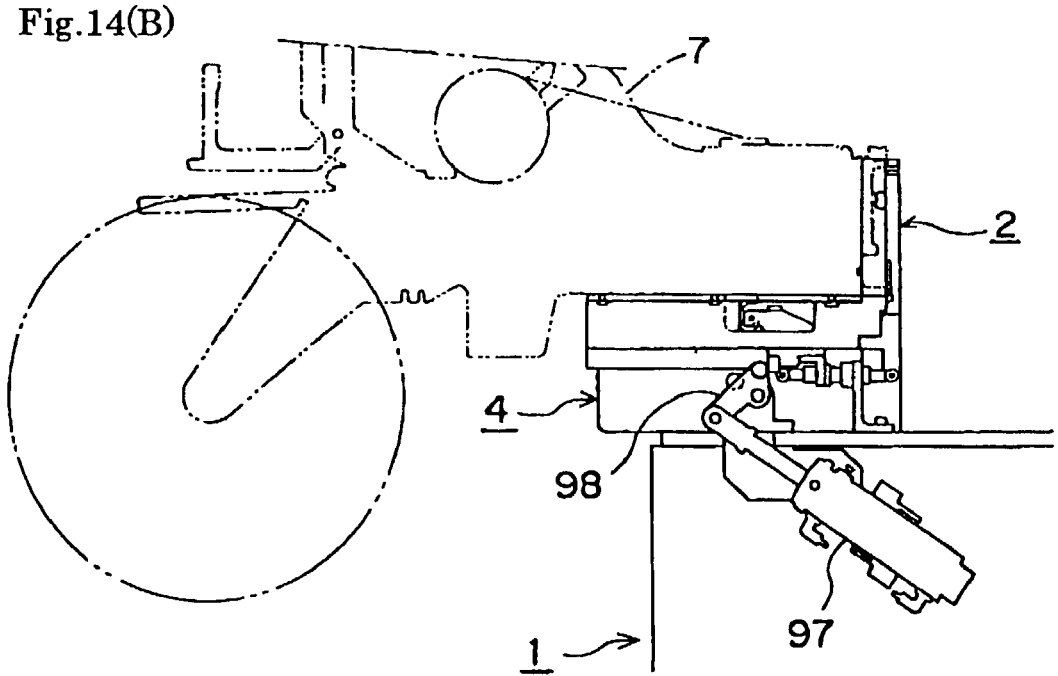

FIGS. 14(A) and 14(B) show how the component supply unit 2 is clamped to the component mounting apparatus 1. FIG. 14(A) shows that the component supply unit 2 passes over an air cylinder 97 attached to the fixing device 4 for clamping, and a clamp lever 98 connected to the air cylinder 97. The component supply unit 2 moves forward to its predetermined fixing position. Then the clamp switch 6 of the component mounting apparatus 1 is operated and, as can be seen in FIG. 14(B), the air cylinder 97 extends to manipulate the clamp lever 98 so as to clamp the component supply unit 2 to the component mounting apparatus 1 for completing a clamping operation.

When the component supply unit 2 is firmly clamped, aforementioned control shaft 71 for controlling hydraulic pressure of the hydraulic jack is fully pushed backward. As a result of this movement of the shaft 71, hydraulic pressure of the hydraulic jack 56 is maintained in a released position (see FIG. 12(C)) for preventing the component supply unit 2 from being lifted. Lifting of the component supply unit 2 at this place may cause damage to structural elements of the component mounting apparatus 1. Also, in this same clamped situation, the air joint 23 provided on the fixing device 4 is connected to the air joint 39 provided on the component supply unit 2, and the connector 33 for transmitting electric signals is connected to the connecting point 78 provided on the end of the cassette 7, thereby air supply and electric signal transmission are secured.

Next, an operation for separating the component supply unit 2 from the component mounting apparatus 1 is described. This operation is basically a reversed movement compared to an attaching operation. Namely, first, turn off the clamp switch 6, and release the component supply unit 2 from the component mounting apparatus 1. Then, as seen in FIG. 13(E), the component supply unit 2 is pull back so that the stopper bolt 16 of the component supply unit 2 contacts the horizontal stopper 26 attached to the fixing device 4, and backward movement of the component supply 2 is once blocked. By this movement, the control shaft 71 extends by one step so as to release a locking position of hydraulic pressure release of the hydraulic jack 56 (see FIG. 12(B)), and as a result, the hydraulic jack 56 enters an operable condition. The operator then operates the pedal 42 for lifting the component supply unit 2 sufficiently to make the stopper bolt 16 clear a level of the horizontal stopper 26, as seen in FIG. 13(F). Then, by moving the cart 3 away from the component mounting apparatus 1 (toward the left in the Y direction), the component supply unit 2 returns to an original position as shown in FIG. 13(A), and a separating operation is completed.

Figure 15A:
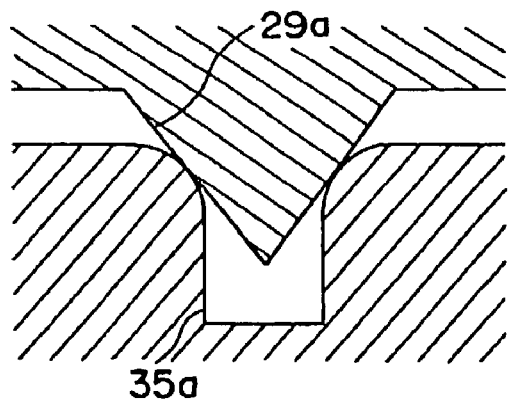
FIGS. 15(A) to 15(D) show a positioning mechanism for one embodiment of a component supply unit according to the present invention.
Figure 15B:
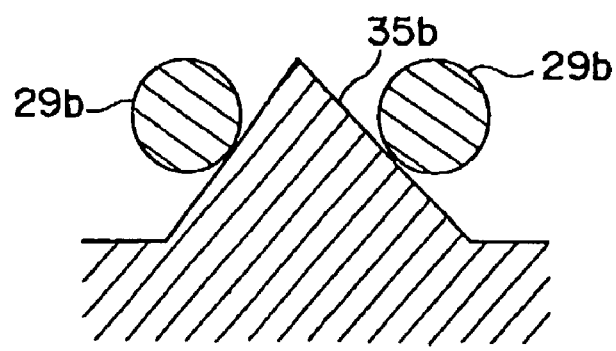

As for positioning the component supply unit 2 onto the component mounting apparatus, the V shaped slot 35 and the square shaped slot 36 are formed on the component supply unit 2, while the positioning pins 29 are provided on the component mounting apparatus 1 in the illustrated example. It should be understood that the present invention is not limited to this arrangement. For example, this relationship may be reversed, i.e. the positioning pins 29 may be provided on the component supply unit 2, and the slots 35 and 36 may be formed in the component mounting apparatus. Alternatively, the V-shaped slot may be modified to be a square shaped slot 35*a* having circular corners at an opening, as shown in FIG. 15(A), into which a V-shaped projection 29*a* formed on fixing device 4 may fit. Another alternative is shown in FIG. 15(B), in which a V-shaped projection 35*b* is formed on the component supply unit 2, which may be sandwiched by a pair of pins 29*b* provided on the fixing device 4.

In these cases, aforementioned "V-shaped" does not necessarily mean that both sides of slanted walls forming the V character are straight and flat walls. These walls may be, for example, curved slanted walls so long as each wall preferably has a single point contact or a line contact with a side of the pins or projections. Also, the pin 29 is not necessarily to be a circular cylinder having a circular cross section, but rather it may be an elliptical cylinder, a spherical form, or any combination thereof, so long as preferably a single point contact or a line contact may be obtained with a side of the slots or openings.

Figure 15C:
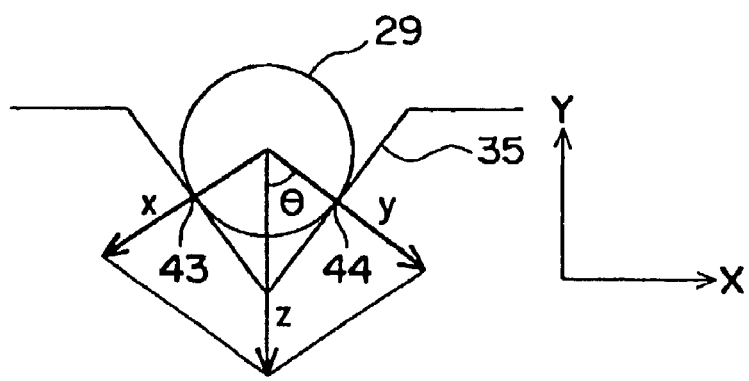
Figure 15D:
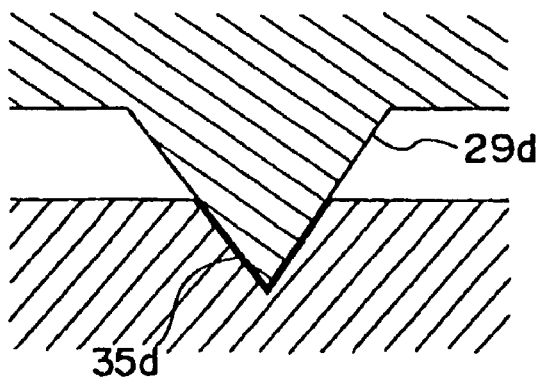

A general relationship between component supply unit 2 and the fixing device 4 at contact points is described by referring to FIG. 15(C). When the component supply unit 2 having the V-shaped slot 35 is pushed against the component mounting apparatus 1 having the positioning pin 29 by a force z, for example, two contact points 43 and 44 are formed, each of which is either a single point contact or a line contact. These two contact points 43 and 44 favorably divide pushing force z into two component forces x and y pointing obliquely right and left in an X direction of this figure by having an angle between each other. In order to accurately position the component supply unit 2, it is preferable that angles θ between a vector of the pushing force z and both vectors of the component force x and y are equal to or more than 45°. When the component supply unit 2 is pushed against the component mounting apparatus 1, the component supply unit 2 is positioned not only in the Y direction by that pushing force, but also it is positioned in the X direction by these component forces x and y, extending both ways in the X direction. In FIG. 15(C), the vectors of pushing force z and both component forces x and y are shown as reaction forces in reverse direction for easier understanding. Alternatively, as shown in FIG. 15(D), either one of the component supply unit 2 or the fixing device 4 may have a projection 29*d*, and the other one may have a V-shaped slot 35*d* for positioning the component supply unit 2, thereby generating oblique component forces by virtue of plane-to-plane contact. Therefore, the phrase "two point contacts" used here includes this kind of plane-to-plane contact case.

The square shaped slot 36 (see FIG. 5), or another contact point of the component supply unit 2, may alternatively be formed as a flat surface without having the slot 36 for making contact with either the positioning pin 29 or a flat surface formed at the fixing device 4. This other contact point of the component supply unit 2 may also be a circular projection or a circular dent for making contact with either the positioning pin 29 or a projection formed on the fixing device 4. Since the V-shaped slot 35 positions the component supply unit 2 in both Y and X directions as describe above, the square shaped slot 36 side may be required to position the component supply unit 2 only in the Y direction. At a square shaped slot side, it is also desirable to make a single point contact or a line contact in order to accurately position the component supply unit 2.

In the present embodiment, the component supply unit 2 is designed to be positioned in a horizontal direction by using base plate 11 located on its bottom. However, it is also possible to use an upper side of the component supply unit 2 as a base plate for positioning the component supply unit 2. That is, for example, an upper surface of the base plate 11 may contact a horizontal guide plane provided on the fixing device 4 by pushing the component supply unit 2 from its bottom for positioning the component supply unit 2 in the horizontal direction. This case, however, needs some outside forces to push the component supply unit 2 upward against a base plane located above for a purpose of overcoming gravity.

Next, a second embodiment of the cart for changing a component supply unit according to the present invention is described. Cart 3 according to this present embodiment includes a buffer type fixing mechanism for securely positioning component supply unit 2 on holder 80 of the cart 3 so that the component supply unit 2 would not fall off the cart 3 while being mounted on the cart. This buffer type fixing mechanism also makes it possible to separate the cart 3 from the component supply unit 2 when it is installed on the component mounting apparatus 1.

As mentioned before, the component supply unit 2 is equipped with a plurality of cassettes 7, weighing 50 kg to 200 kg. Accordingly, if the component supply unit 2 falls off the cart 3 by accident, it may be dangerous and it may cost much by damaging precious components. As explained before by referring to FIG. 6, two types of cassettes 7 with different reel holding positions (which is either 8 or 8*a*) may be used for the cart 3 according to the present invention. When the cassette 7 having the reel position 8*a* is attached to the component supply unit 2, a center of gravity of the component supply unit 2 is shifted toward the left in the Y direction of this figure. Therefore, if the component supply unit 2 is only placed on the cart without having any supports, more likely the component supply unit 2 falls off the cart 3.

If, for example, bolts are used to fix the component supply unit 2 onto the cart 3 for preventing the component supply unit 2 from falling, the cart 3, which is fixed to the component supply unit 2 with the bolts, may hinder positioning of the component supply unit 2 when it is installed onto the component mounting apparatus 1. The present embodiment provides a buffer type fixing mechanism for solving this problem.

Figure 16:
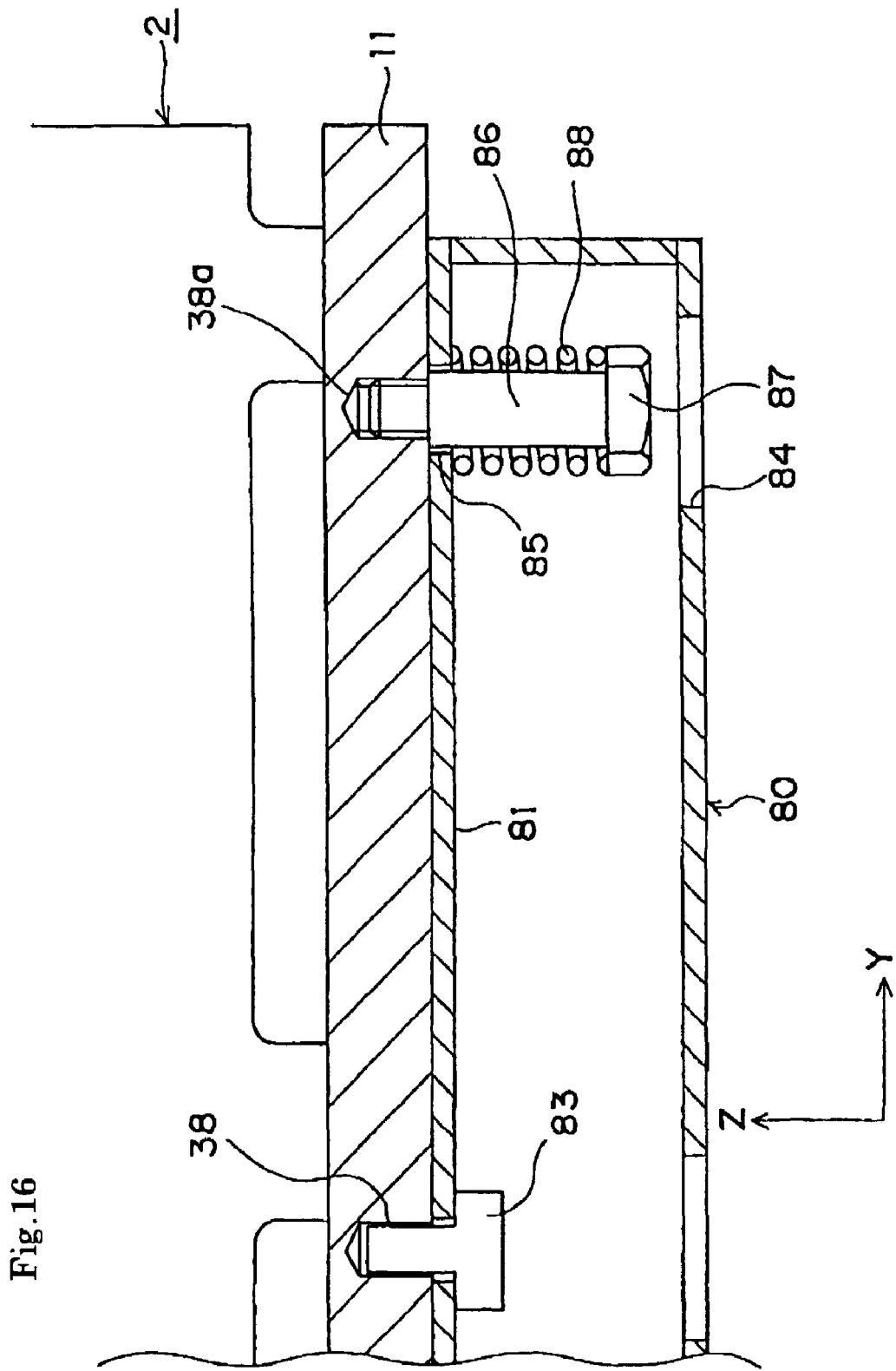
FIG. 16 is a fragmentary cross sectional view of a buffer type fixing mechanism for fixing a component supply unit, which may be used for one embodiment of a cart for changing a component supply unit according to the present invention.
Figure 17:
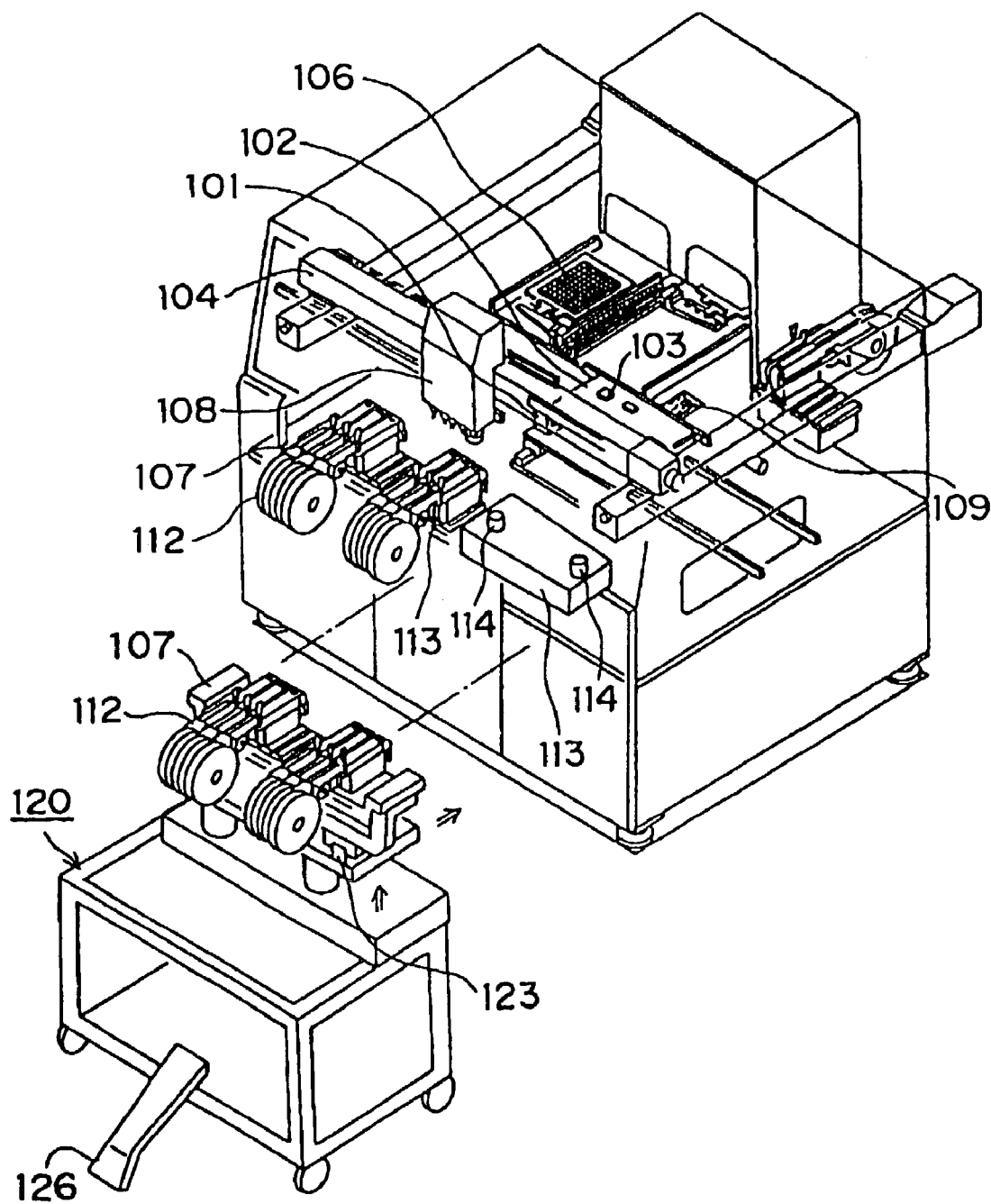
FIG. 17 is a schematic perspective view of a component mounting apparatus using a cart for changing a component supply unit of prior art.

FIG. 16 shows, in enlarged scale, the buffer type fixing mechanism according to the present embodiment, which is arranged on holding arms 81 for supporting the component supply unit 2 on the holder 80. FIG. 16 shows a side elevational view of the holder 80. Right hand side in a Y direction of this figure faces the component mounting apparatus 1. Referring to the figure, the component supply unit 2 is mounted on the holding arms 81 of the cart 3, and base plate 11 located on a bottom of the component supply unit 2 contacts upper surfaces of both of the holding arms 81. In the illustrated embodiment, an internal thread is formed inside positioning holes 38a of the base plate 11. Shoulder bolts 86 are inserted into a large through hole 84 and a small through hole 85 formed on each of box-type holding arm 81, and then the shoulder bolts 86 are screwed up into the positioning holes 38a.

The large through hole 84 is designed to have sufficient space for screwing the shoulder bolt 86 after it is inserted into hole 84. The small through hole 85 is designed to have a proper clearance between the hole 85 and a larger diameter of the shoulder bolt 86 for positioning the shoulder bolt 86. A portion of the holding arm 81 surrounding the small through hole 85 provides a seat for a spring 88. The spring 88 is compressed between a bolt head 87 of the shoulder bolt 86 and the seat around the small through hole 85 so as to render a spring force for pulling the shoulder bolt 86 downward in a Z direction of FIG. 16. By this arrangement, the shoulder bolt 86 provides a pulling force for holding the component supply unit 2 in its position and preventing it from falling by pulling the base plate 11 toward the holding arm 81.

In FIG. 16, one more positioning hole 38 located away from the component mounting apparatus 1 (left side in this figure) is designed only to hold positioning pin 83. This positioning hole 38, however, may also be arranged to have a similar buffer type mechanism with the shoulder bolt 86 and the spring 88.

Operation of the buffer type mechanism described above is as follows. In FIG. 16, when a counterclockwise force is applied to the component supply unit 2, the spring 88 withholds such applied force, if it is small, and prevents the component supply unit 2 from falling. When a relatively large force is applied to the component supply unit 2, the spring 88 may absorb this applied force by its elasticity, and pull the component supply unit 2 back to its original position on the holding arm 81. When even a larger force is applied to the component supply unit 2, the spring 88 is compressed up to its minimum length, which means the spring 88, the bolt head 87 of the shoulder bolt 86 and the holing arm 81 are integrated into a single rigid body to work together for holding the component supply unit 2 against this applied force.

When the component supply unit 2 held by such buffer type fixing mechanism is to be mounted on the component mounting apparatus 1, the operator operates the grip 93 (see FIG. 6) of the cart 3 for lowering both the holding arms 81 and the component supply unit 2, after the cart 3 moves forward to a predetermined position. By this operation, the base plate 11 located on the bottom of the component supply unit 2 is placed on the horizontal guide plate 24 (see FIG. 4) provided on the fixing device 4 of the component mounting apparatus 1, and the component supply unit 2 is positioned in a horizontal direction. In this situation, if the cart does not have the buffer type fixing mechanism of the present embodiment, but rather the component supply unit 2 is firmly fixed to the holding arms 81 by bolts, horizontal positioning of the base plate 11 of the component supply unit 2 is hindered by the holding arms 81. In case, for example, the cart 3 is inclined in a horizontal direction, and hence the holding arms 81 fixed to the cart 3 are also inclined, the base plate 11 would not fully contact the horizontal guide plate 24. Accordingly, proper horizontal positioning of the component supply unit 2 on the component mounting apparatus 1 may not be achieved by such bolt type fixing mechanism.

According to the buffer type fixing mechanism of the present embodiment, on the other hand, after the base plate 11 of the component supply unit 2 is placed on the horizontal guide plate 24, the holding arms 81 may be further lowered by compressing the spring 88, and this allows the base plate 11 to be separated from the holding arms 81. Accordingly, even in a case in which the cart is inclined, the holding arms 81 would not hinder the positioning of the component supply unit 2, and therefore, the base plate 11 may be completely placed on the horizontal guide plate 24. In other words, by providing the buffer type fixing mechanism of the present embodiment on the holding arms 81, the cart 3 or the holing arms 81 would not hinder a positioning operation of the component supply unit 2.

In the illustrated buffer type fixing mechanism, the shoulder bolts 86 are used for functioning as a positioning mechanism of the component supply unit 2, as well as a holding mechanism to hold the component supply unit 2 on top of the holding arms 81. Alternatively, at least two positioning pins 83 may be used to position the component supply unit 2 in its proper location, and separately some form of holding force may be used to place the component supply unit 2 firmly onto the holing arms 81 for achieving a similar buffer function. This holding force may be applied by an elastic material, such as a spring, to connect the component supply unit 2 and the cart 3 for pulling each other. The shoulder bolts 86 may alternatively be normal bolts as long as loosening between the bolts and the positioning holes 38a is prevented.

Next, a third embodiment of the cart for changing a component supply unit of the present invention is described by referring to the appended drawings. Cart 3 according to this present embodiment is designed to be separated from the component mounting apparatus 1, after component supply unit 2 is clamped to the component mounting apparatus 1. If the cart 3 is separable, the cart 3 may be used for other purposes, such as installing another component supply unit 2 onto another fixing device 4 of the component mounting apparatus 1.

Referring to FIG. 1, the cart 3a is holding the component supply unit 2a, which is already mounted on the component mounting apparatus 1. This is because, as explained before, the collecting box 10 for collecting used component supplying tapes or their covering tapes, and the reel box 9 for accommodating the reel 8 of the cassettes 7 provided in the central area of the cart 3 may be fully utilized. Depending on a situation, however, it may be useful to make the cart 3 separable from the component mounting apparatus 1 by eliminating the collecting box 10 and the reel box 9.

Toward this end, the cart 3 according to the present embodiment is designed to be separated from the component mounting apparatus 1. In order to make the cart 3 separable, it is necessary to remove all elements which may interfere with the component supply unit 2 or other related elements remaining at a component mounting apparatus side when the cart 3 is separated from the component mounting apparatus 1. These components that may interfere with others include the connecting bar 89 of the holder 80 which connects both of the elevating rods 53 as shown in FIG. 10, and a pair of the holding arms 81 fixed to the connecting bar 89, in addition to the reel box and the collecting box.

The holding arms 81 may be fixed directly to the elevating rods 53, thereby possible interference with other elements may be avoided. The connecting bar 89 may be eliminated so long as the holding arms 81 are fixed to other elements. The connecting bar 89, however, also functions to strengthen the lifters 50 by connecting both of the elevating rods 53 together. Therefore, it may be required to add some alternative reinforcement to the lifters 50 if the connecting bar 89 is removed. Possible countermeasures for this, for example, are to strengthen a connecting portion between the supporting frame 51 and the base frame 40, or to increase rigidity of the elevating rods 53, both of which are relatively easy. All other mechanisms and structures may remain similar to those used for the cart 3 shown in the first embodiment. By making these measures for eliminating possible obstacles and applying necessary reinforcement, the cart 3 may be separated from the component mounting apparatus 1 after the component supply unit 2 is clamped to the component mounting apparatus 1. Then, the cart 3 may be used for other purposes.

As explained above, according to the cart of the present invention for changing a component supply unit to be used for a component mounting apparatus, wide space in a central area of the cart may be obtained by accommodating a driver inside a base frame, and by locating a pair of elevating rods at both side ends of the cart. By providing a reel box for accommodating a reel portion of cassette 7, and a collecting box for collecting used component supplying tapes and their cover tapes into such a box, total floor space for the component mounting apparatus may by smaller. Further, this advantage may be achieved by using an inexpensive mechanism such as linear moving bearings or rails on a lifter.

Furthermore, according to the present invention, falling of the component supply unit, or possible damage to the component mounting apparatus caused by erroneous lifting and lowering motions of the component supply unit, may be avoided by restricting a lowering motion of the component supply unit when it is separated from the component mounting apparatus, and by restricting lifting motions of the component supply unit when it is mounted on the component mounting apparatus, and hence, safety operations may be secured when the cart according to the present invention is used.

Further, by using a positioning mechanism of the component supply unit according to the present invention, repeated accurate positioning may be achieved by only pushing the component supply unit toward the component mounting apparatus in one direction.

Furthermore, by using a buffer type fixing mechanism for mounting the component supply unit onto the cart for changing a component supply unit, falling of the component supply unit may be avoided and positioning in a horizontal direction may not be hindered by the cart. By adding this function, it becomes possible to hold the component supply unit on the cart in a stable condition, without being influenced by variations of weight balance of the component supply unit due to the number of supplying devices attached to the component supply unit.

And, by making the cart for changing a component supply unit separable from the component supply unit and the component mounting apparatus, the cart may be used for any other purpose during a time that the component supply unit is attached to the component mounting apparatus.

What is claimed is:

1. A cart for changing a component supply unit, which component supply unit is connectible with and separable from a component mounting apparatus for a purpose of simultaneously changing a plurality of supplying devices attached to the component supply unit by installing the component supply unit onto the component mounting apparatus or removing the component supply unit from the component mounting apparatus, comprising:

a base frame having wheels including caster wheels;

lifters fixed to said base frame;

a driver, accommodated inside said base frame, for simultaneously driving said lifters, said driver including a hydraulic jack and a lever mechanism, said lever mechanism including (i) a first lever for changing extending and retracting movements of said hydraulic jack into circular movements, (ii) a shaft fixing said first lever in a rotatable manner about an axis of said shaft, and (iii) second levers for simultaneously lifting or lowering said lifters, with one end of each of said second levers being fixed to a corresponding end of said shaft so as to be rotatable about the axis of said shaft; and a holder, fixed to said lifters, for holding the component supply unit, wherein the cart has a multi purpose utility space beneath the component supply unit when held by said holder, said multi purpose space being surrounded by said base frame and said lifters, wherein each of said lifters comprises an elevating rod to be driven by said driver for performing lifting and lowering movements, and a supporting frame having a linear bearing structure for movably supporting said elevating rod in up and down directions, and wherein said linear bearing structure comprises:

(i) first engaging elements on an outer surface of said elevating rod along a first direction parallel to the up and down directions of said elevating rod, said first engaging elements including one first engaging element on one side of said outer surface and another first engaging element on a second side of said outer surface, with said one side and said second side opposing one another in a second direction perpendicular to said first direction; and (ii) second engaging elements, on circumferences of at least three guide rollers rotatably fixed to said supporting frame, for holding said elevating rod from opposing sides along said second direction, such that when said first engaging elements engage said second engaging elements, said at least three guide rollers guide a movement of said elevating rod along said first direction while restricting movement of said elevating rod along said second direction and also restricting movement of said elevating rod along a third direction perpendicular to both said first and second directions.

2. The cart according to claim 1, wherein said at least three guide rollers comprise:

two guide rollers located on said one side of said outer surface of said elevating rod and spaced from one another along said first direction; and one guide roller located on said second side of said outer surface of said elevating rod and substantially centrally located between said two guide rollers along said first direction.

3. The cart according to claim 1, wherein a cross section, perpendicular to said first direction, of each of said first engaging elements or each of said second engaging elements exhibits an extension, and a cross section, perpendicular to said first direction, of each of the other of said first or second engaging elements exhibits an indentation.

4. A cart for changing a component supply unit, which component supply unit is connectible with and separable from a component mounting apparatus for a purpose of simultaneously changing a plurality of supplying devices attached to the component supply unit by installing the component supply unit onto the component mounting apparatus or removing the component supply unit from the component mounting apparatus, comprising:

a base frame;

lifters fixed to said base frame;

a driver, accommodated inside said base frame, for simultaneously driving said lifters, said driver including a hydraulic jack and a lever mechanism, said lever mechanism including (i) a first lever for changing extending and retracting movements of said hydraulic jack into circular movements, (ii) a shaft fixing said first lever in a rotatable manner about an axis of said shaft, and (iii) second levers for simultaneously lifting or lowering said lifters, with one end of each of said second levers being fixed to a corresponding end of said shaft so as to be rotatable about the axis of said shaft; and a holder, fixed to said lifters, for holding the component supply unit, wherein each of said lifters comprises an elevating rod to be driven by said driver for performing lifting and lowering movements, and a supporting frame having a linear bearing structure for movably supporting said elevating rod in up and down directions, and wherein said linear bearing structure comprises:

(i) first engaging elements on an outer surface of said elevating rod along a first direction parallel to the up and down directions of said elevating rod, said first engaging elements including one first engaging element on one side of said outer surface and another first engaging element on a second side of said outer surface, with said one side and said second side opposing one another in a second direction perpendicular to said first direction; and (ii) second engaging elements, on circumferences of at least three guide rollers rotatably fixed to said supporting frame, for holding said elevating rod from opposing sides along said second direction, such that when said first engaging elements engage said second engaging elements, said at least three guide rollers guide a movement of said elevating rod along said first direction while restricting movement of said elevating rod along said second direction and also restricting movement of said elevating rod along a third direction perpendicular to both said first and second directions.

5. The cart according to claim 4, wherein said at least three guide rollers comprise:

two guide rollers located on said one side of said outer surface of said elevating rod and spaced from one another along said first direction; and one guide roller located on said second side of said outer surface of said elevating rod and substantially centrally located between said two guide rollers along said first direction.

6. The cart according to claim 4, wherein a cross section, perpendicular to said first direction, of each of said first engaging elements or each of said second engaging elements exhibits an extension, and a cross section, perpendicular to said first direction, of each of the other of said first or second engaging elements exhibits an indentation.

* * * * *